United States Patent
Park et al.

(10) Patent No.: US 11,189,677 B2
(45) Date of Patent: Nov. 30, 2021

(54) ORGANIC LIGHT EMITTING DIODE DISPLAY DEVICE AND METHOD OF MANUFACTURING AN ORGANIC LIGHT EMITTING DIODE DISPLAY DEVICE

(71) Applicant: Samsung Display Co., Ltd., Yongin-Si (KR)

(72) Inventors: Joon Seok Park, Yongin-si (KR); Yeon Keon Moon, Hwaseong-si (KR); Kwang Suk Kim, Suwon-si (KR); Tae Sang Kim, Seoul (KR); Geunchul Park, Suwon-si (KR); Kyung Jin Jeon, Incheon (KR)

(73) Assignee: Samsung Display Co., Ltd.

( * ) Notice: Subject to any disclaimer, the term of this patent is extended or adjusted under 35 U.S.C. 154(b) by 0 days.

(21) Appl. No.: 16/539,761

(22) Filed: Aug. 13, 2019

(65) Prior Publication Data

US 2020/0052056 A1 Feb. 13, 2020

(30) Foreign Application Priority Data

Aug. 13, 2018 (KR) ........................ 10-2018-0094569

(51) Int. Cl.
*H01L 27/32* (2006.01)
*H01L 51/56* (2006.01)

(52) U.S. Cl.
CPC .......... *H01L 27/3262* (2013.01); *H01L 51/56* (2013.01); *H01L 2227/32* (2013.01); *H01L 2251/306* (2013.01); *H01L 2251/308* (2013.01)

(58) Field of Classification Search
CPC ............. H01L 27/3211; H01L 27/3218; H01L 27/3225
See application file for complete search history.

(56) References Cited

U.S. PATENT DOCUMENTS

| | | |
|---|---|---|
| 8,628,987 B2 | 1/2014 | Yamazaki |
| 9,634,038 B2 | 4/2017 | Kwon et al. |
| (Continued) | | |

FOREIGN PATENT DOCUMENTS

KR  10-1785688 B1  10/2017

OTHER PUBLICATIONS

Ji Yong Noh, Dong Min Han (SID Member), Woo Cheol Jeong, Jong Woo Kim (SID Member), Soo Youle Cha, "Development of 55" 4K UHD OLED TV employing the internal gate IC with high reliability and short channel IGZO TFTs", 6 Pages(36–41), Noh et al. /OLED TV, GIP, oxide TFT, reliability, short channel, Journal of the SID 26/1, 2018, © Copyright 2018 Society for Information Display 1071-0922/18/2601-0628$1.00.

(Continued)

*Primary Examiner* — Jae Lee
(74) *Attorney, Agent, or Firm* — Innovation Counsel LLP

(57) ABSTRACT

An organic light emitting diode display device includes a substrate, a first oxide transistor, a second oxide transistor, and a sub-pixel structure. The substrate has a display region including a plurality of sub-pixel regions and a peripheral region located in a side of the display region. The first oxide transistor is disposed in the peripheral region on the substrate, and includes a first oxide semiconductor pattern that includes tin (Sn). The second oxide transistor is disposed in the sub-pixel regions each on the substrate, and includes a second oxide semiconductor pattern. The sub-pixel structure is disposed on the second oxide transistor.

8 Claims, 12 Drawing Sheets

(56) References Cited

U.S. PATENT DOCUMENTS

| | | | |
|---|---|---|---|
| 2016/0284741 A1* | 9/2016 | Wang | H01L 29/66969 |
| 2017/0236470 A1* | 8/2017 | Miki | G09G 3/3258 |
| | | | 345/690 |
| 2018/0358562 A1* | 12/2018 | Takita | H05B 47/11 |

OTHER PUBLICATIONS

Rongsheng Chen*, Wei Zhou, Meng Zhang, Man Wong, Hoi Sing Kwok, Center for Display Research, Department of Electronic and Computer Engineering, Hong Kong University of Science and Technology, ClearWater Bay, Kowloon, Hong Kong, "Self-aligned top-gate InGaZnO thin film transistors using SiO2/Al2O3 stack gate dielectric", 4 Pages (572-575), © 2013 Elsevier B.V. All rights reserved., http://dx.doi.org/10.1016/j.tsf.2013.09.020.

* cited by examiner

ORGANIC LIGHT EMITTING DIODE DISPLAY DEVICE AND METHOD OF MANUFACTURING AN ORGANIC LIGHT EMITTING DIODE DISPLAY DEVICE

CROSS-REFERENCE TO RELATED APPLICATION(S)

This application claims priority under 35 USC § 119 to Korean Patent Applications No. 10-2018-0094569, filed on Aug. 13, 2018 in the Korean Intellectual Property Office (KIPO), the contents of which are incorporated herein in its entirety by reference.

BACKGROUND

1. Field

Example embodiments relate generally to an organic light emitting diode display device and a method of manufacturing an organic light emitting diode display device. More particularly, embodiments of the present inventive concept relate to an organic light emitting diode display device including a gate driver and a method of manufacturing an organic light emitting diode display device including a gate driver.

2. Description of the Related Art

A flat panel display ("FPD") device is widely used as a display device in an electronic device because the FPD device is lightweight and thin compared to a cathode-ray tube ("CRT") display device. Typical examples of the FPD device include a liquid crystal display ("LCD") device and an organic light emitting diode ("OLED") display device. Compared to the LCD device, the OLED display device may have higher luminance and a wider viewing angle. In addition, the OLED display device can be made thinner because the OLED display device does not require a backlight unit. In the OLED display device, electrons and holes are injected into an organic thin layer through a cathode and an anode, and then recombined in the organic thin layer to generate excitons, thereby emitting a light of a certain wavelength.

The OLED display device may include a display region displaying an image and a peripheral region surrounding the display region, and a gate driver, a data driving unit, and a plurality of wirings are disposed in the peripheral region. A plurality of transistors may be disposed in the gate driver, and a plurality of transistors may be disposed in the display region. As the OLED display device becomes larger and has a high luminance, the number of transistors included in the gate driver that is disposed in the peripheral region (e.g., a dead space) may be relatively increased. In this case, an area of the peripheral region may be increased.

SUMMARY

Some example embodiments provide an organic light emitting diode (OLED) display device including a gate driver.

Some example embodiments provide a method of manufacturing an OLED display device including a gate driver.

According to some example embodiments, an OLED display device includes a substrate, a first oxide transistor, a second oxide transistor, and a sub-pixel structure. The substrate has a display region including a plurality of sub-pixel regions, and has a peripheral region located at a side of the display region. The first oxide transistor is disposed in the peripheral region on the substrate, and includes a first oxide semiconductor pattern that includes tin (Sn). The second oxide transistor is disposed in the sub-pixel regions each on the substrate, and includes a second oxide semiconductor pattern. The sub-pixel structure is disposed on the second oxide transistor.

In example embodiments, the second oxide semiconductor pattern might not include Sn.

In example embodiments, the first oxide transistor and the second oxide transistor may be located at a same layer.

In example embodiments, the first oxide transistor may further include a first gate electrode disposed on the first oxide semiconductor pattern and first source and first drain electrodes disposed on the first gate electrode.

In example embodiments, the OLED display device may further include a gate driver generating a gate signal. The gate driver may be disposed in the peripheral region on the substrate, and may include a transistor. The transistor included in the gate driver may correspond to the first oxide transistor.

In example embodiments, the OLED display device may further include a third oxide transistor disposed in the sub-pixel regions each on the substrate. The third oxide transistor includes a third oxide semiconductor pattern, and the third oxide semiconductor pattern may include Sn. The second oxide transistor may correspond to a driving transistor, and the third oxide transistor may correspond to a switching transistor.

In example embodiments, the first oxide semiconductor pattern, the second oxide semiconductor pattern, and the third oxide semiconductor pattern may be located at a same layer.

In example embodiments, the first oxide semiconductor pattern and the third oxide semiconductor pattern may include same materials.

In example embodiments, the first oxide semiconductor pattern may include at least one of tin oxide (SnO), indium-tin oxide (ITO), zinc-tin oxide (ZTO), indium-zinc-tin oxide (IZTO), tin-aluminum-zinc oxide (TAZO), indium-gallium-tin oxide (IGTO), and indium-tin-gallium-zinc oxide (ITGZO).

In example embodiments, the second oxide semiconductor pattern may include at least one of zinc oxide (ZnO), gallium oxide (GaO), titanium oxide (TiO), indium oxide (InO), indium-gallium oxide (IGO), indium-zinc oxide (IZO), gallium-zinc oxide (GZO), zinc-magnesium oxide (ZMO), zinc-zirconium oxide (ZnZrO), indium-gallium-zinc oxide (IGZO), and indium-gallium-hafnium oxide (IGHO).

According to some example embodiments, a method of manufacturing an OLED display device is provided as follows.

A substrate having a display region including a plurality of sub-pixel regions, the substrate having a peripheral region located at a side of the display region is provided. A first preliminary oxide semiconductor layer is formed on the substrate. A first oxide semiconductor pattern including Sn is formed in the peripheral region on the substrate after the first preliminary oxide semiconductor layer is patterned using a first etchant. A second preliminary oxide semiconductor layer is formed on the substrate and the first oxide semiconductor pattern. A second oxide semiconductor pattern is formed in the sub-pixel regions each after the second preliminary oxide semiconductor layer is patterned using a second etchant. A sub-pixel structure is formed on the second oxide semiconductor pattern.

In example embodiments, the second oxide semiconductor pattern might not include Sn.

In example embodiments, when the second preliminary oxide semiconductor layer is formed on the first oxide semiconductor pattern, the second preliminary oxide semiconductor layer may be in direct contact with the first oxide semiconductor pattern.

In example embodiments, when the second preliminary oxide semiconductor layer is patterned using the second etchant, the second etchant may be in direct contact with the first oxide semiconductor pattern.

In example embodiments, the first etchant may be different from the second etchant, and the first oxide semiconductor pattern might not be etched by the second etchant.

In example embodiments, the first etchant may include a compound that includes fluorine (F).

In example embodiments, the second etchant may comprise phosphoric acetic nitric acid.

In example embodiments, the method may further include forming a third oxide semiconductor pattern, which includes Sn, in each of the sub-pixel regions.

In example embodiments, the first oxide semiconductor pattern, the second oxide semiconductor pattern, and the third oxide semiconductor pattern may be located at a same layer.

In example embodiments, the first oxide semiconductor pattern and the third oxide semiconductor pattern may be simultaneously formed using same materials.

As the OLED display device in accordance with example embodiments includes the first oxide transistor having a relatively high electron mobility, the gate driver may include a relatively small number of transistors. Accordingly, a dead space of the OLED display device may be reduced. In addition, as the gate driver includes a relatively small number of transistors, a manufacturing cost of the OLED display device may be decreased. Further, as the second oxide transistor includes the second oxide semiconductor pattern except for Sn, the second oxide transistor may have a relatively large driving range.

In a method of manufacturing the OLED display device according to example embodiments, as oxide transistors having different characteristics to each other are manufactured in a same layer by using the first etchant and the second etchant without an add of a mask, a manufacturing cost of the OLED display device may be relatively reduced.

BRIEF DESCRIPTION OF THE DRAWINGS

Example embodiments can be understood in more detail from the following description taken in conjunction with the accompanying drawings, in which.

DETAILED DESCRIPTION OF THE EMBODIMENTS

Hereinafter, embodiments of the present inventive concept will be explained in detail with reference to the accompanying drawings.

Figure 1:
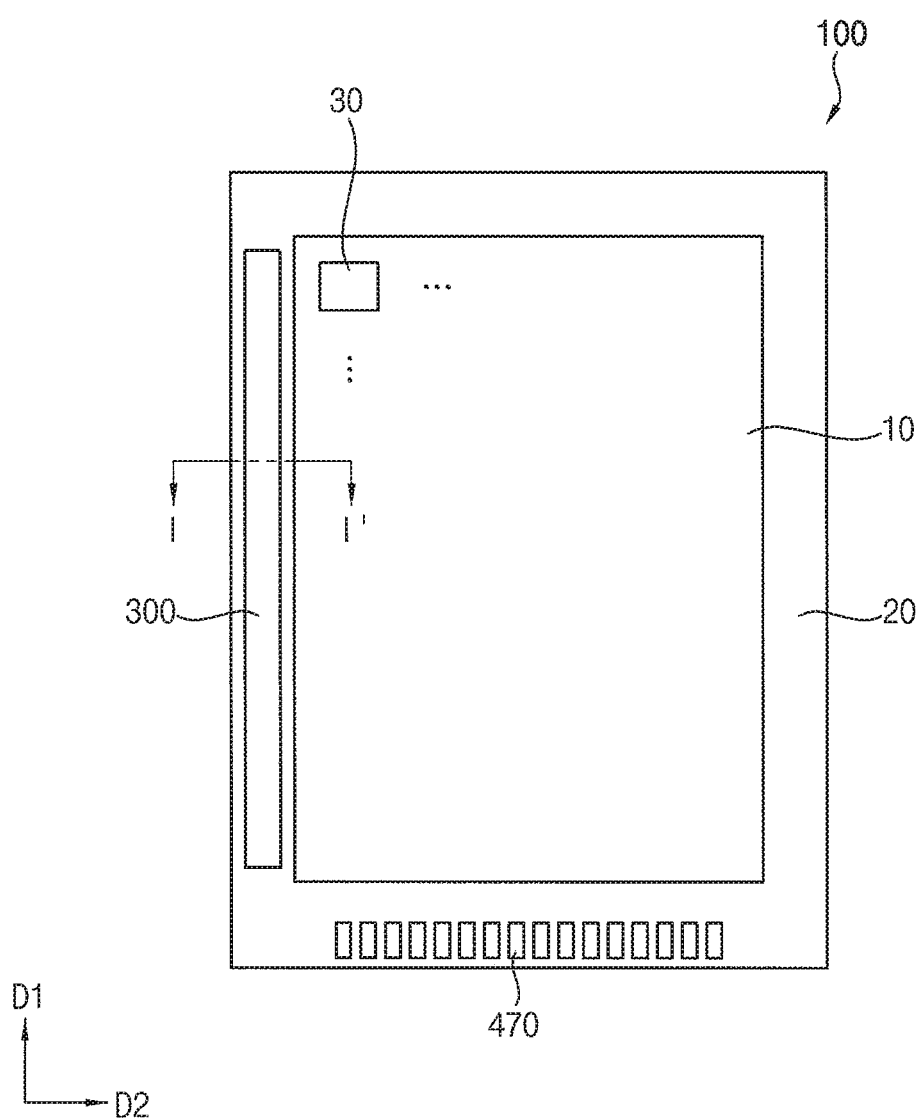
FIG. 1 is a plan view illustrating an organic light emitting diode (OLED) display device in accordance with example embodiments.
Figure 2:
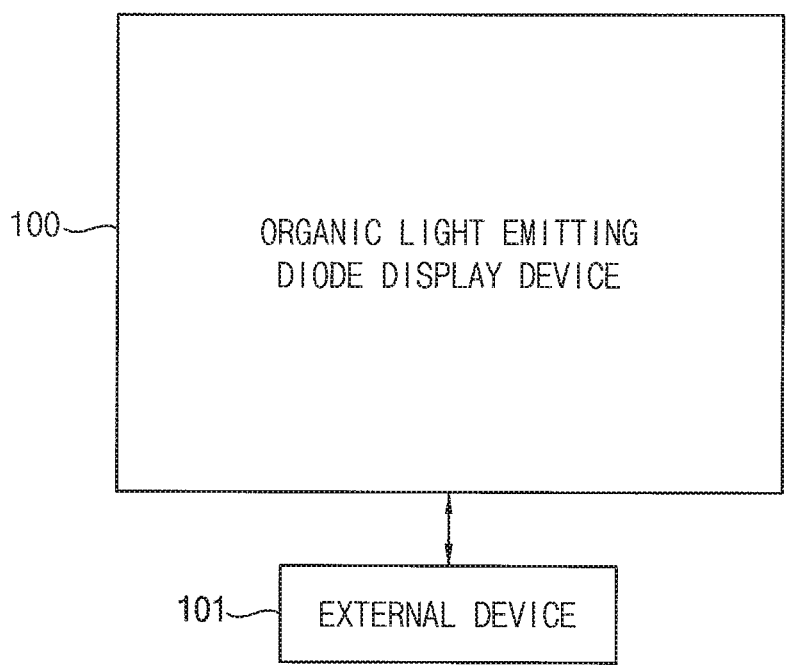
FIG. 2 is a block diagram for describing an external device electrically connected to the OLED display device of FIG. 1.

FIG. 1 is a plan view illustrating an organic light emitting diode (OLED) display device in accordance with example embodiments, and FIG. 2 is a block diagram for describing an external device electrically connected to the OLED display device of FIG. 1.

Referring to FIGS. 1 and 2, an organic light emitting diode (OLED) display device 100 may have a display region 10 and a peripheral region 20 surrounding the display region 10. Here, the display region 10 may include a plurality of sub-pixel regions 30. The sub-pixel regions 30 may be arranged in a matrix in the entire display region 10. For example, the sub-pixel regions 30 may be repeatedly arranged along a first direction D1 and a second direction D2. Here, the first direction D1 may be parallel to an upper surface of the OLED display device 100, and the second direction D2 may be perpendicular to the first direction D1. A gate driver 300 may be disposed at one side of the peripheral region 20 (e.g., a left side of the display region 10), and a plurality of pad electrodes 470 may be disposed at another side of the peripheral region 20 (e.g., a bottom side of the display region 10). Alternatively, the gate driver 300 may be disposed at a right side or top side of the display region 10. In some example embodiments, the OLED display device 100 may further include a data driver, a timing controller, a light emission driver, etc, and these may be disposed in the peripheral region 20.

A sub-pixel circuit (e.g., a sub-pixel circuit SUB-PIXEL CIRCUIT of FIG. 3) may be disposed in each of the sub-pixel regions 30 in the display region 10, and an OLED may be disposed on the sub-pixel circuit. An image may be displayed through the sub-pixel circuit and the OLED.

First, second, and third sub-pixel circuits may be disposed in the sub-pixel regions 30. For example, the first sub-pixel circuit may be coupled to (or connected to) a first OLED capable of emitting a red color of light, and the second sub-pixel circuit may be coupled to a second OLED capable of emitting a green color of light. The third sub-pixel circuit may be coupled to the third OLED capable of emitting a blue color of light.

In example embodiments, the first OLED may be disposed to overlap the first sub-pixel circuit, and the second OLED may be disposed to overlap the second sub-pixel circuit. The third OLED may be disposed to overlap the third sub-pixel circuit. Alternatively, the first OLED may be disposed to overlap a portion of the first sub-pixel circuit and a portion of a sub-pixel circuit that is different from the first sub-pixel circuit, and the second OLED may be disposed to overlap a portion of the second sub-pixel circuit and a portion of a sub-pixel circuit that is different from the second sub-pixel circuit. The third OLED may be disposed to overlap a portion of the third sub-pixel circuit and a portion of a sub-pixel circuit that is different from the third sub-pixel circuit.

For example, the first, second, and third OLEDs may be arranged using an RGB stripe method where tetragons of a same size are sequentially arranged, an s-stripe method including a blue OLED having a relatively large area, a WRGB method further including a white OLED, a pen-tile method repeatedly arranged in an RG-GB pattern, etc.

In addition, at least one driving transistor, at least one switching transistor, and at least one capacitor may be disposed in the sub-pixel regions 30 each. In example embodiments, one driving transistor (e.g., a first transistor TR1 of FIG. 3), five switching transistors (e.g., second through seventh transistor TR2, TR3, TR4, TR5, TR6, and TR7), and one capacitor (e.g., a storage capacitor CST of FIG. 3) may be disposed in each of the sub-pixel regions 30. In example embodiments, a channel of the driving transistor may consist essentially of an oxide semiconductor, and a channel of the switching transistor may consist essentially of an oxide semiconductor including tin (Sn). Alternatively, the channel of the switching transistor may consist essentially of the oxide semiconductor not including Sn.

In example embodiments, a shape of each of the sub-pixel regions 30 has a plan shape of a tetragon, but the present inventive concept is not limited thereto. For example, a shape of each of the sub-pixel regions 30 may have a plan shape of a triangle, a plan shape of a diamond, a plan shape of a polygon, a plan shape of a circle, a plan shape of an athletic track, a plan shape of an elliptic, and so forth.

An external device 101 may be electrically connected to the OLED display device 100 through a flexible printed circuit board ("FPCB"). For example, a side of the FPCB may be in direct contact with the pad electrodes 470, and another side of the FPCB may be in direct contact with the external device 101. The external device 101 may provide a data signal, a gate signal, a light emission signal, a gate initialization signal, an initialization voltage, a power supply, etc to the OLED display device 100. In addition, a driving integrated circuit may be mounted (e.g., installed) in the FPCB. In some example embodiments, the driving integrated circuit may be mounted in the OLED display device 100 that is located adjacent to the pad electrodes 470. Alternatively, when the OLED display device 100 includes a bending region, the pad electrodes 470 and the external device 101 may be electrically connected through a printed circuit board ("PCB").

The gate driver 300 may receive the gate signal and the gate initialization signal from the external device 101, and may provide the gate signal and the gate initialization signal to the sub-pixel circuits. In example embodiments, the gate driver 300 may include a plurality of transistors (e.g., a first oxide transistor 650 of FIG. 4), and a channel of the transistors each may consist essentially of an oxide semiconductor including Sn. When the gate driver 300 includes the transistors including the oxide semiconductor that includes Sn, the gate driver 300 may include a transistor having a relatively high electron mobility. In this case, the gate driver 300 may include a relatively small number of transistors, and the OLED display device 100 may include the peripheral region 20 having a relatively reduced area. That is, a dead space of the OLED display device 100 may be decreased.

Figure 3:
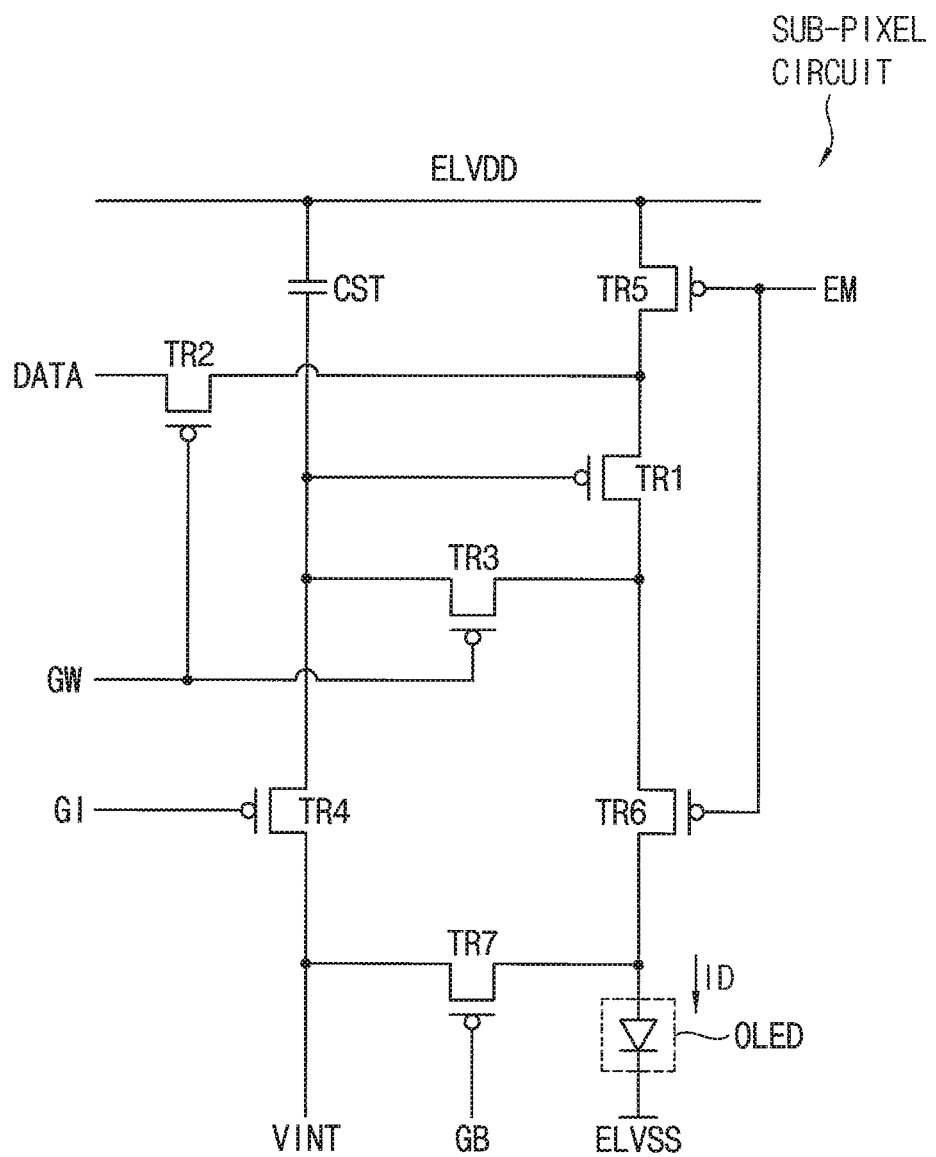
FIG. 3 is a circuit diagram illustrating a sub-pixel circuit and an OLED disposed on the sub-pixel circuit which are disposed in a sub-pixel region of FIG. 1.

FIG. 3 is a circuit diagram illustrating a sub-pixel circuit and an OLED disposed on the sub-pixel circuit which are disposed in a sub-pixel region of FIG. 1.

Referring to FIG. 3, a sub-pixel circuit SUB-PIXEL CIRCUIT ("SPC") and an OLED (e.g., corresponding to a sub-pixel structure 200 of FIG. 4) may be disposed in each of the sub-pixel regions 30 in the OLED display device 100, and the OLED may be disposed on the sub-pixel circuit SPC. One sub-pixel circuit SPC may include first, second, third, fourth, fifth, sixth, and seventh transistors TR1, TR2, TR3, TR4, TR5, TR6, and TR7, a storage capacitor CST, a high power supply ELVDD wiring, a low power supply ELVSS wiring, an initialization voltage VINT wiring, a data signal DATA wiring, a gate signal GW wiring, a gate initialization signal GI wiring, a light emission signal EM wiring, a diode initialization signal GB wiring, etc.

The OLED may emit light based on a driving current ID. The OLED may include a first terminal and a second terminal. In example embodiments, the second terminal of the OLED receives a low power supply ELVSS. For example, the first terminal of the OLED is an anode terminal, and the second terminal of the OLED is a cathode terminal.

Alternatively, the first terminal of the OLED may be a cathode terminal, and the second terminal of the OLED may be an anode terminal. In example embodiments, the anode terminal of the OLED may correspond to a lower electrode 290 of FIG. 4, and the cathode terminal of the OLED may correspond to an upper electrode 340 of FIG. 4.

The first transistor TR1 (e.g., a second oxide transistor 250 of FIG. 4) may include a gate terminal, a first terminal, and a second terminal. In example embodiments, the first terminal of the first transistor TR1 is a source terminal, and the second terminal of the first transistor TR1 is a drain terminal. Alternatively, the first terminal of the first transistor TR1 may be a drain terminal, and the second terminal of the first transistor TR1 may be a source terminal. For example, a channel of the first transistor TR1 (e.g., a second oxide semiconductor pattern 130 of FIG. 4) may consist essentially of an oxide semiconductor that does not include Sn.

The driving current ID may be generated by the first transistor TR1. In example embodiments, the first transistor TR1 operates in a saturation region. In this case, the first transistor TR1 may generate the driving current ID based on a voltage difference of the gate terminal and the source terminal, and a gradation may be implemented based on the amount of the driving current ID generated by the first transistor TR1. Alternatively, the first transistor TR1 operates in a linear region. In this case, a gradation may be implemented based on the amount of time during which the first transistor TR1 provides the driving current ID to the OLED within one frame.

The second transistor TR2 may include a gate terminal, a first terminal, and a second terminal. A gate signal GW may be applied to the gate terminal of the second transistor TR2. The first terminal of the second transistor TR2 may receive a data signal DATA. The second terminal of the second transistor TR2 may be connected to the first terminal of the first transistor TR1. For example, the gate signal GW may be generated from the gate driver 300 of FIG. 1, and may be applied to the gate terminal of the second transistor TR2 through the gate signal GW wiring. In example embodiments, the first terminal of the second transistor TR2 is a source terminal, and the second terminal of the second transistor TR2 is a drain terminal. In addition, a channel of the second transistor TR2 may consist essentially of an oxide semiconductor including Sn. Alternatively, the first terminal of the second transistor TR2 may be a drain terminal, and the second terminal of the second transistor TR2 may be a source terminal.

The second transistor TR2 may provide the data signal DATA to the first terminal of the first transistor TR1 while the gate signal GW is activated. In this case, the second transistor TR2 operates in a linear region.

The third transistor TR3 may include a gate terminal, a first terminal, and a second terminal. The gate terminal of the third transistor TR3 may receive a gate signal GW. The first terminal of the third transistor TR3 may be connected to the gate terminal of the first transistor TR1. The second terminal of the third transistor TR3 may be connected to the second terminal of the first transistor TR1. For example, the gate signal GW may be generated from the gate driver 300 of FIG. 1, and the gate signal GW may be applied to the gate terminal of the third transistor TR3 through the gate signal GW wiring. In example embodiments, the first terminal of the third transistor TR3 is a source terminal, and the second terminal of the third transistor TR3 is a drain terminal. In addition, a channel of the third transistor TR3 may consist essentially of an oxide semiconductor including Sn. Alternatively, the first terminal of the third transistor TR3 may be a drain terminal, and the second terminal of the third transistor TR3 may be a source terminal.

The third transistor TR3 may connect the gate terminal of the first transistor TR1 to the second terminal of the first transistor TR1 while the gate signal GW is activated. In this case, the third transistor TR3 may operate in a linear region. That is, the third transistor TR3 may form a diode connection of the first transistor TR1 while the gate signal GW is activated. A voltage difference, which corresponds to a threshold voltage of the first transistor TR1, between the first terminal of the first transistor TR1 and the gate terminal of the first transistor TR1 may occur due to the diode connection of the first transistor TR1. As a result, a sum voltage of the data signal DATA provided to the first terminal of the first transistor TR1 and the voltage difference (i.e., the threshold voltage) may be applied to the gate terminal of the first transistor TR1 while the gate signal GW is activated. Thus, the data signal DATA may be compensated as much as the threshold voltage of the first transistor TR1. The compensated data signal DATA may be applied to the gate terminal of the first transistor TR1. A uniformity of the driving current ID may be improved because of reducing an affect by the threshold voltage of the first transistor TR1.

An input terminal of the initialization voltage VINT wiring providing an initialization voltage VINT is connected to a first terminal of the fourth transistor TR4 and a first terminal of the seventh transistor TR7, and an output terminal of the initialization voltage VINT wiring is connected to a second terminal of the fourth transistor TR4 and a first terminal of the storage capacitor CST.

The fourth transistor TR4 may include a gate terminal, a first terminal, and a second terminal. The gate terminal of the fourth transistor TR4 may receive a gate initialization signal GI. For example, the gate initialization signal GI may be generated from the gate driver 300 of FIG. 1, and the gate initialization signal GI may be applied to the gate terminal of the fourth transistor TR4 through the gate initialization signal GI wiring. The initialization voltage VINT may be applied to the first terminal of the fourth transistor TR4. The second terminal of the fourth transistor TR4 may be connected to the gate terminal of the first transistor TR1. In example embodiments, the first terminal of the fourth transistor TR4 is a source terminal, and the second terminal of the fourth transistor TR4 is a drain terminal. In addition, a channel of the fourth transistor TR4 may consist essentially of an oxide semiconductor including Sn. Alternatively, the first terminal of the fourth transistor TR4 may be a drain terminal, and the second terminal of the fourth transistor TR4 may be a source terminal.

The fourth transistor TR4 may apply the initialization voltage VINT to the gate terminal of the first transistor TR1 while the gate initialization signal GI is activated. In this case, the fourth transistor TR4 may operate in the linear region. Thus, the fourth transistor TR4 may initialize the gate terminal of the first transistor TR1 as the initialization voltage VINT while the gate initialization signal GI is activated. In example embodiments, a voltage level of the initialization voltage VINT is sufficiently lower than a voltage level of the data signal DATA maintained by the storage capacitor CST in a previous frame. The initialization voltage VINT may be applied to the gate terminal of the first transistor TR1 that is a P-channel metal oxide semiconductor ("PMOS") type transistor. In some example embodiments, a voltage level of the initialization voltage VINT is sufficiently higher than the voltage level of the data signal DATA maintained by the storage capacitor CST in a previous frame. The initialization voltage VINT may be applied to the gate terminal of the first transistor TR1 that is an N-channel metal oxide semiconductor ("NMOS") type transistor.

In example embodiments, the gate initialization signal GI is identical to the gate signal GW advanced by one horizontal time period. For example, the gate initialization signal GI that is applied to sub-pixel circuit located in a (n)th row among a plurality of sub-pixel circuits SPC included in the OLED display device 100 (where n is an integer of 2 or more) may be substantially a same as the gate signal GW that is applied to sub-pixel circuit located in a (n−1)th row among a plurality of the sub-pixel circuits SPC. That is, the gate initialization signal GI that is activated may be applied to the sub-pixel circuit located in the (n)th row among the sub-pixel circuits SPC by applying the gate signal GW that is activated to the sub-pixel circuit located in the (n−1)th row among the sub-pixel circuits SPC. As a result, the gate terminal of the first transistor TR1 included in the sub-pixel circuit located in the (n)th row among the sub-pixel circuits SPC may be initialized as the initialization voltage VINT when the data signal DATA is applied to sub-pixel circuit located in the (n−1)th row among the sub-pixel circuits SPC.

The fifth transistor TR5 may include a gate terminal, a first terminal, and a second terminal. A light emission signal EM may be applied to the gate terminal of the fifth transistor TR5. A high power supply ELVDD may be applied to the first terminal of the fifth transistor TR5. The second terminal of the fifth transistor TR5 may be connected to the first terminal of the first transistor TR1. In example embodiments, the first terminal of the fifth transistor TR5 is a source terminal, and the second terminal of the fifth transistor TR5 is a drain terminal. In addition, a channel of the fifth transistor TR5 may consist essentially of an oxide semiconductor including Sn. In some example embodiments, the first terminal of the fifth transistor TR5 may be a drain terminal, and the second terminal of the fifth transistor TR5 may be a source terminal.

The fifth transistor TR5 may apply the high power supply ELVDD to the first terminal of the first transistor TR1 while the light emission signal EM is activated. On the other hand, the fifth transistor TR5 does not apply the high power supply ELVDD while the light emission signal EM is not activated. In this case, the fifth transistor TR5 may operate in the linear region. The fifth transistor TR5 may apply the high power supply ELVDD to the first terminal of the first transistor TR1 while the light emission signal EM is activated, such that the first transistor TR1 generates the driving current ID. In addition, the fifth transistor TR5 does not apply the high power supply ELVDD while the light emission signal EM is not activated, such that the data signal DATA applied to the first terminal of the first transistor TR1 is applied to the gate terminal of the first transistor TR1.

The sixth transistor TR6 (e.g., a third oxide transistor 255 of FIG. 4) may include a gate terminal, a first terminal, and a second terminal. The light emission signal EM may be applied to the gate terminal of the sixth transistor TR6. The first terminal of the sixth transistor TR6 may be connected to the second terminal of the first transistor TR1. The second terminal of the sixth transistor TR6 may be connected to the first terminal of the OLED. In example embodiments, the first terminal of the sixth transistor TR6 is a source terminal, and the second terminal of the sixth transistor TR6 is a drain terminal. In addition, a channel of the sixth transistor TR6 (e.g., a third oxide semiconductor pattern 135 of FIG. 4) may consist essentially of an oxide semiconductor including Sn. In some example embodiments, the first terminal of the sixth transistor TR6 may be a drain terminal, and the second terminal of the sixth transistor TR6 may be a source terminal.

The sixth transistor TR6 may provide the driving current ID generated by the first transistor TR1 to the OLED while the light emission signal EM is activated. In this case, the sixth transistor TR6 may operate in the linear region. That is, the sixth transistor TR6 may provide the driving current ID generated by the first transistor TR1 to the OLED while the light emission signal EM is activated, such that the OLED emits light. In addition, the sixth transistor TR6 may electrically disconnect the first transistor TR1 from the OLED while the light emission signal EM is not activated, such that the compensated data signal DATA applied to the second terminal of the first transistor TR1 is applied to the gate terminal of the first transistor TR1.

The seventh transistor TR7 may include a gate terminal, a first terminal, and a second terminal. A diode initialization signal GB may be applied to the gate terminal of the seventh transistor TR7. The initialization voltage VINT may be applied to the first terminal of the seventh transistor TR7. The second terminal of the seventh transistor TR7 may be connected to the first terminal of the OLED. In example embodiments, the first terminal of the seventh transistor TR7 is a source terminal, and the second terminal of the seventh transistor TR7 is a drain terminal. In addition, a channel of the seventh transistor TR7 may consist essentially of an oxide semiconductor including Sn. In some example embodiments, the first terminal of the seventh transistor TR7 may be a drain terminal, and the second terminal of the seventh transistor TR7 may be a source terminal.

The seventh transistor TR7 may apply the initialization voltage VINT to the first terminal of the OLED while the diode initialization signal GB is activated. In this case, the seventh transistor TR7 may operate in the linear region. That is, the seventh transistor TR7 may initialize the first terminal of the OLED as the initialization voltage VINT while the diode initialization signal GB is activated.

Alternatively, the gate initialization signal GI and the diode initialization signal GB are a substantially same signal. An initialization operation of the gate terminal of the first transistor TR1 might not affect an initialization operation of the first terminal of the OLED. That is, the initialization operation of the gate terminal of the first transistor TR1 and the initialization operation of the first terminal of the OLED may be independent to each other. Therefore, the gate initialization signal GI is used as the diode initialization signal GB, thereby improving the manufacturing efficiency.

The storage capacitor CST may include the first terminal and the second terminal, and may be connected between the high power supply ELVDD wiring and the gate terminal of the first transistor TR1. For example, the first terminal of the storage capacitor CST may be connected to the gate terminal of the first transistor TR1, and the second terminal of the storage capacitor CST may be connected to the high power supply ELVDD wiring. The storage capacitor CST may maintain a voltage level of the gate terminal of the first transistor TR1 while the gate signal GW is not activated. The light emission signal EM may be activated while the gate signal GW is not activated (e.g., a section where the gate signal GW is not activated may include a section where the light emission signal EM is activated). The driving current ID generated by the first transistor TR1 may be provided to the OLED while the light emission signal EM is activated. Therefore, the driving current ID generated by the first transistor TR1 may be provided to the OLED based on the voltage level maintained by the storage capacitor CST.

Figure 4:
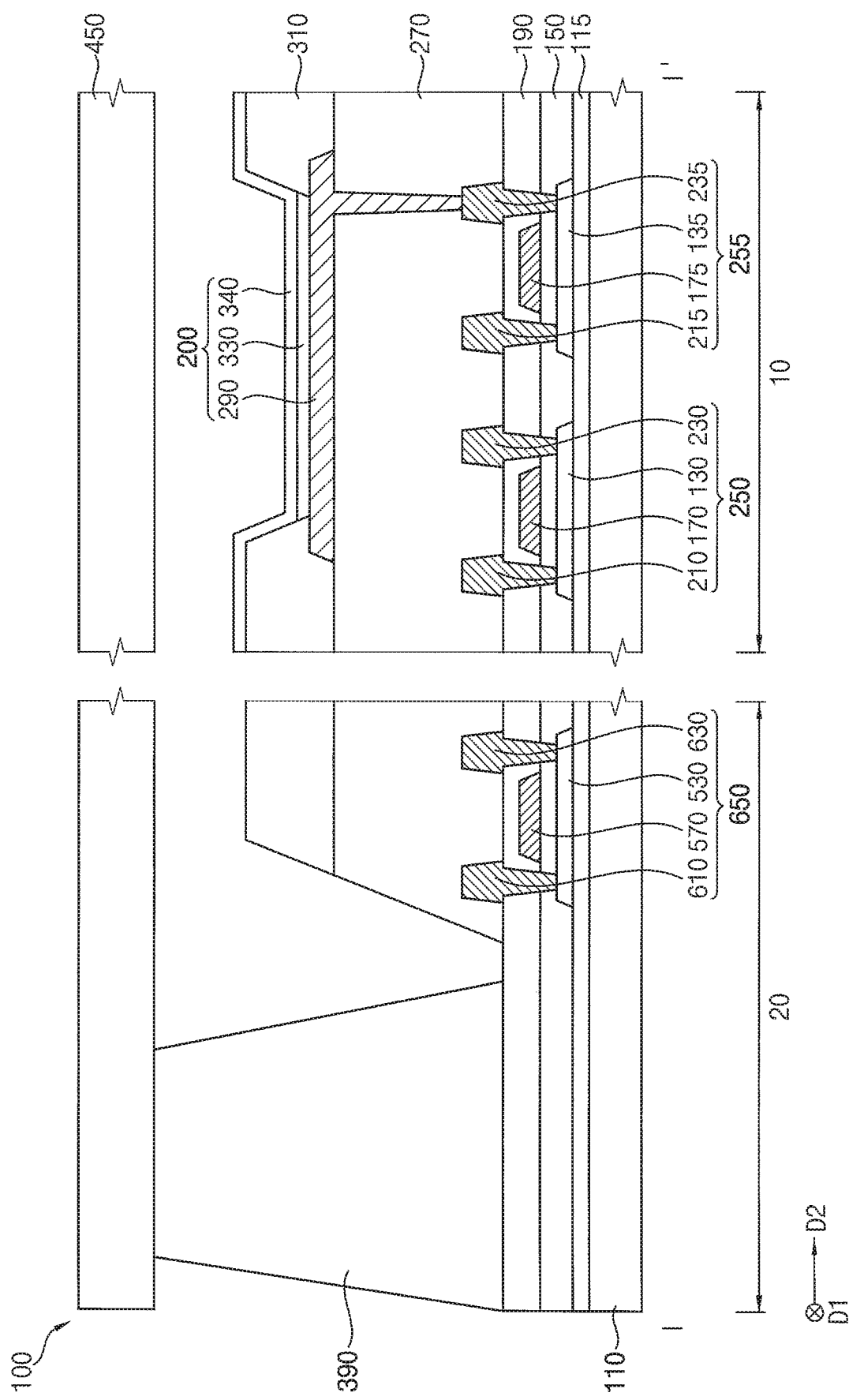
FIG. 4 is a cross-sectional view taken along a line I-I' of FIG. 1.

FIG. 4 is a cross-sectional view taken along a line I-I' of FIG. 1.

Referring to FIG. 4, an OLED display device 100 may include a substrate 110, a buffer layer 115, a first oxide transistor 650, a second oxide transistor 250, a third oxide transistor 255, a gate insulation layer 150, an insulating interlayer 190, a planarization layer 270, a sub-pixel structure 200, a pixel defining layer 310, a seal member 390, an encapsulation substrate 450, etc. The first oxide transistor 650 may include a first oxide semiconductor pattern 530, a first gate electrode 570, a first source electrode 610, and a first drain electrode 630, and the second oxide transistor 250 may include a second oxide semiconductor pattern 130, a second gate electrode 170, a second source electrode 210, and a second drain electrode 230. In addition, the third oxide transistor 255 may include a third oxide semiconductor pattern 135, a third gate electrode 175, a third source electrode 215, and a third drain electrode 235. Further, the sub-pixel structure 200 may include a lower electrode 290, a light emitting layer 330, and an upper electrode 340. As the OLED display device 100 has the display region 10 and the peripheral region 20, the substrate 110 may be divided into the display region 10 and the peripheral region 20.

The substrate 110 including transparent or opaque insulation materials may be provided. The substrate 110 may include a quartz substrate, a synthetic quartz substrate, a calcium fluoride substrate, a fluoride-doped quartz substrate, a soda-lime glass substrate, a non-alkali glass substrate, a combination thereof, and so forth.

Alternatively, the substrate 110 may include a flexible transparent material such as a flexible transparent resin substrate (e.g., a polyimide substrate). In this case, the polyimide substrate may include a first polyimide layer, a barrier film layer, a second polyimide layer, and so forth. For example, the substrate 110 may have a structure in which the first polyimide layer, the barrier film layer, and the second polyimide layer are sequentially stacked on a rigid glass substrate. In other words, since the polyimide substrate is relatively thin and flexible, the polyimide substrate may be formed on a rigid glass substrate to help support the formation of the upper structure. In a method of manufacturing the OLED display device 100, after an insulation layer (e.g., the buffer layer 115) is provided on the second polyimide layer of the polyimide substrate, an upper structure (e.g., the first oxide transistor 650, the second oxide transistor 250, the third oxide transistor 255, the sub-pixel structure 200, etc) may be formed on the insulation layer. After the upper structure is formed on the insulation layer, the rigid glass substrate on which the polyimide substrate is formed may be removed. That is, it may be difficult to directly form the upper structure on the polyimide substrate because the polyimide substrate is relatively thin and flexible. Accordingly, the upper structure is formed on the polyimide substrate and the rigid glass substrate, and then the polyimide substrate may serve as the substrate 110 after the removal of the rigid glass substrate.

The buffer layer 115 may be disposed on the entire substrate 110. The buffer layer 115 may prevent the diffusion of metal atoms and/or impurities from the substrate 110 into the first oxide transistor 650, the second oxide transistor 250, the third oxide transistor 255, and the sub-pixel structure 200. In addition, the buffer layer 115 may improve a surface flatness of the substrate 110 when a surface of the substrate 110 is relatively irregular. According to example embodiments, in the substrate 110, at least two buffer layers 115 may be provided on the substrate 110, or the buffer layer 115 may not be disposed. For example, the buffer layer 115 may include organic materials or inorganic materials.

The first oxide semiconductor pattern 530 may be disposed in the peripheral region 20 on the buffer layer 115. The first oxide semiconductor pattern 530 may include an oxide semiconductor that includes tin (Sn). In other words, the first oxide semiconductor pattern 530 may include an oxide semiconductor layer including at least one of two-component compound ($AB_x$), ternary compound ($AB_xC_y$), four-component compound ($AB_xC_yD_z$), and so forth. These compounds contain Sn together with indium (In), zinc (Zn), gallium (Ga), titanium (Ti), aluminum (Al), hafnium (Hf), zirconium (Zr), magnesium (Mg), and so forth. For example, the first oxide semiconductor pattern 530 may include at least one of tin oxide (SnO), indium-tin oxide (ITO), zinc-tin oxide (ZTO), indium-zinc-tin oxide (IZTO), tin-aluminum-zinc oxide (TAZO), indium-gallium-tin oxide (IGTO), indium-tin-gallium-zinc oxide (ITGZO), and so forth. In example embodiments, the first oxide semiconductor pattern 530 may consist essentially of ITGZO.

The second oxide semiconductor pattern 130 may be disposed in the display region 10 (or a sub-pixel region 30) on the buffer layer 115. The second oxide semiconductor pattern 130 may include an oxide semiconductor not including Sn. In other words, the second oxide semiconductor pattern 130 may include an oxide semiconductor layer including at least one of $AB_x$, $AB_xC_y$, $AB_xC_yD_z$, and so forth. These compounds contain at least one of In, Zn, Ga, Ti, Al, Hf, Zr, Mg, and so forth. For example, the second oxide semiconductor pattern 130 may include at least one of zinc oxide (ZnO), gallium oxide (GaO), titanium oxide (TiO), indium oxide (InO), indium-gallium oxide (IGO), indium-zinc oxide (IZO), gallium-zinc oxide (GZO), zinc-magnesium oxide (ZMO), zinc-zirconium oxide (ZnZrO), indium-gallium-zinc oxide (IGZO), indium-gallium-hafnium oxide (IGHO), and so forth. In example embodiments, the second oxide semiconductor pattern 130 may consist essentially of IGZO.

The third oxide semiconductor pattern 135 may be disposed in the display region 10 on the buffer layer 115. The third oxide semiconductor pattern 135 may be spaced apart from the second oxide semiconductor pattern 130 in the second direction D2. The third oxide semiconductor pattern 135 may include an oxide semiconductor that includes Sn. In other words, the third oxide semiconductor pattern 135 may include an oxide semiconductor layer including at least one of $AB_x$, $AB_xC_y$, $AB_xC_yD_z$, and so forth. These compounds contain Sn together with In, Zn, Ga, Ti, Al, Hf, Zr, Mg, and so forth. For example, the third oxide semiconductor pattern 135 may include SnO, ITO, ZTO, IZTO, TAZO, IGTO, ITGZO, and so forth. In example embodiments, the third oxide semiconductor pattern 135 may consist essentially of ITGZO.

For example, in a method of manufacturing the OLED display device 100, the first oxide semiconductor pattern 530 and the third oxide semiconductor pattern 135 may include same materials, and may be simultaneously formed. Meanwhile, after the first oxide semiconductor pattern 530 and the third oxide semiconductor pattern 135 are formed, the second oxide semiconductor pattern 130 may be formed. Although the second oxide semiconductor pattern 130 is formed later than the first oxide semiconductor pattern 530 and the third oxide semiconductor pattern 135, the first oxide semiconductor pattern 530, the second oxide semiconductor pattern 130, and the third oxide semiconductor pattern 135 may be disposed on the buffer layer 115. That is, the first oxide semiconductor pattern 530, the second oxide semiconductor pattern 130, and the third oxide semiconductor pattern 135 may be located at a same layer.

The gate insulation layer 150 may be disposed on the buffer layer 115, the first oxide semiconductor pattern 530, the second oxide semiconductor pattern 130, and the third oxide semiconductor pattern 135. The gate insulation layer 150 may cover the first oxide semiconductor pattern 530 in the peripheral region 20 on the buffer layer 115, and may extend in the second direction D2 on the buffer layer 115. In addition, the gate insulation layer 150 may cover the second and third oxide semiconductor patterns 130 and 135 in the display region 10 on the buffer layer 115, and may extend in the second direction D2 on the buffer layer 115. That is, the gate insulation layer 150 may be disposed on the entire buffer layer 115. For example, the gate insulation layer 150 may sufficiently cover the first, second and third oxide semiconductor patterns 530, 130 and 135 on the buffer layer 115, and may have a substantially flat upper surface without a step around the first, second and third oxide semiconductor patterns 530, 130 and 135. Alternatively, the gate insulation layer 150 may cover the first, second and third oxide semiconductor patterns 530, 130 and 135 on the buffer layer 115, and may be disposed as a substantially uniform thickness along a profile of the first, second and third oxide semiconductor patterns 530, 130 and 135. The gate insulation layer 150 may include silicon compound, metal oxide, and so forth. For example, the gate insulation layer 150 may include silicon oxide ($SiO_x$), silicon nitride ($SiN_x$), silicon oxynitride ($SiO_xN_y$), silicon oxycarbide ($SiO_xC_y$), silicon carbon nitride ($SiC_xN_y$), aluminum oxide ($AlO_x$), aluminum nitride ($AlN_x$), tantalum oxide ($TaO_x$), hafnium oxide ($HfO_x$), zirconium oxide ($ZrO_x$), titanium oxide ($TiO_x$), and so forth.

The first gate electrode 570 may be disposed in the peripheral region 20 on the gate insulation layer 150. The first gate electrode 570 may be disposed on a portion of the gate insulation layer 150 under which the first oxide semiconductor pattern 530 is located. The first gate electrode 570 may include a metal, a metal alloy, metal nitride, conductive metal oxide, transparent conductive materials, and so forth. For example, the first gate electrode 570 may include gold (Au), silver (Ag), aluminum (Al), tungsten (W), copper (Cu), platinum (Pt), nickel (Ni), titanium (Ti), palladium (Pd), magnesium (Mg), calcium (Ca), lithium (Li), chromium (Cr), tantalum (Ta), molybdenum (Mo), scandium (Sc), neodymium (Nd), iridium (Ir), an alloy of aluminum, aluminum nitride ($AlN_x$), an alloy of silver, tungsten nitride ($WN_x$), an alloy of copper, an alloy of molybdenum, titanium nitride ($TiN_x$), chromium nitride ($CrN_x$), tantalum nitride ($TaN_x$), strontium ruthenium oxide (SRO), zinc oxide ($ZnO_x$), indium tin oxide (ITO), stannum oxide ($SnO_x$), indium oxide ($InO_x$), gallium oxide ($GaO_x$), indium zinc oxide (IZO), and so forth. These may be used alone or in a suitable combination thereof. Alternatively, the first gate electrode 570 may have a multi-layered structure including a plurality of layers.

The second gate electrode 170 may be disposed in the display region 10 on the gate insulation layer 150. The second gate electrode 170 may be disposed on a portion of the gate insulation layer 150 under which the second oxide semiconductor pattern 130 is located. The second gate electrode 170 may include a metal, a metal alloy, metal nitride, conductive metal oxide, transparent conductive materials, etc. These may be used alone or in a suitable combination thereof. Alternatively, the second gate electrode 170 may have a multi-layered structure including a plurality of layers.

The third gate electrode 175 may be disposed in the display region 10 on the gate insulation layer 150, may be spaced apart from the second gate electrode 170 in the second direction D2. The third gate electrode 175 may be disposed on a portion of the gate insulation layer 150 under which the third oxide semiconductor pattern 135 is located. The third gate electrode 175 may include a metal, a metal alloy, metal nitride, conductive metal oxide, transparent conductive materials, and so forth. These may be used alone or in a suitable combination thereof. Alternatively, the third gate electrode 175 may have a multi-layered structure including a plurality of layers.

For example, in a method of manufacturing the OLED display device 100, the first gate electrode 570, the second gate electrode 170, and the third gate electrode 175 may be simultaneously formed on the gate insulation layer 150 by using same materials. In other words, the first gate electrode 570, the second gate electrode 170, and the third gate electrode 175 may be located at a same layer.

The insulating interlayer 190 may be disposed on the gate insulation layer 150, the first gate electrode 570, the second gate electrode 170, and the third gate electrode 175. The insulating interlayer 190 may cover the first gate electrode 570 in the peripheral region 20 on the gate insulation layer 150, and may extend in the second direction D2 on the gate insulation layer 150. In addition, the insulating interlayer 190 may cover the second and third gate electrodes 170 and 175 in the display region 10 on the gate insulation layer 150, and may extend in the second direction D2 on the gate insulation layer 150. That is, the insulating interlayer 190 may be disposed on the entire gate insulation layer 150. For example, the insulating interlayer 190 may sufficiently cover the first, second, and third gate electrodes 570, 170, and 175 on the gate insulation layer 150, and may have a substantially flat upper surface without a step around the first, second, and third gate electrodes 570, 170, and 175. Alternatively, the insulating interlayer 190 may cover the first, second, and third gate electrodes 570, 170, and 175 on the gate insulation layer 150, and may be disposed as a substantially uniform thickness along a profile of the first, second, and third gate electrodes 570, 170, and 175. The insulating interlayer 190 may include silicon compound, metal oxide, and so forth.

The first source electrode 610 and the first drain electrode 630 may be disposed in the peripheral region 20 on the insulating interlayer 190. The first source electrode 610 may be in contact with a source region of the first oxide semiconductor pattern 530 via a first contact hole formed by removing a first portion of the gate insulation layer 150 and the insulating interlayer 190, and the first drain electrode 630 may be in contact with a drain region of the first oxide semiconductor pattern 530 via a second contact hole formed by removing a second portion of the gate insulation layer 150 and the insulating interlayer 190. Each of the first source electrode 610 and the first drain electrode 630 may include a metal, an alloy, metal nitride, conductive metal oxide, transparent conductive materials, and so forth. These may be used alone or in a suitable combination thereof. Alternatively, each of the first source and first drain electrodes 610 and 630 may have a multi-layered structure including a plurality of layers. Accordingly, the first oxide transistor 650 including the first oxide semiconductor pattern 530, the first gate electrode 570, the first source electrode 610, and the first drain electrode 630 may be disposed. Here, the first oxide transistor 650 may serve as a transistor of the gate driver 300 including the first oxide semiconductor pattern 530 that includes Sn. The transistor may have a relatively high electron mobility. In addition, the first oxide transistor 650 may serve as a transistor having a top gate structure. In some example embodiments, the first oxide transistor 650 may overlap the seal member 390.

In example embodiments, the gate driver 300 of the OLED display device 100 includes one transistor (e.g., the first oxide transistor 650), but is not limited thereto. For example, the gate driver 300 may have a configuration including at least two transistors and at least one capacitor.

In addition, the first oxide transistor 650 of the gate driver 300 has a top gate structure, but not being limited thereto. For example, the first oxide transistor 650 may have a bottom gate structure or a double gate structure.

Further, a configuration of the first oxide transistor 650 includes the first oxide semiconductor pattern 530, the first gate electrode 570, the first source electrode 610, and the first drain electrode 630, but not being limited thereto. For example, the first oxide transistor 650 may have a configuration including the first oxide semiconductor pattern 530, the gate insulation layer 150, the first gate electrode 570, the insulating interlayer 190, the first source electrode 610, and the first drain electrode 630.

The second source electrode 210 and the second drain electrode 230 may be disposed in the display region 10 on the insulating interlayer 190. The second source electrode 210 may be in contact with a source region of the second oxide semiconductor pattern 130 via a third contact hole formed by removing a third portion of the gate insulation layer 150 and the insulating interlayer 190, and the second drain electrode 230 may be in contact with a drain region of the second oxide semiconductor pattern 130 via a fourth contact hole formed by removing a fourth portion of the gate insulation layer 150 and the insulating interlayer 190. Each of the second source electrode 210 and the second drain electrode 230 may include a metal, an alloy, metal nitride, conductive metal oxide, transparent conductive materials, and so forth. These may be used alone or in a suitable combination thereof. Alternatively, each of the second source and second drain electrodes 210 and 230 may have a multi-layered structure including a plurality of layers. Accordingly, the second oxide transistor 250 including the second oxide semiconductor pattern 130, the second gate electrode 170, the second source electrode 210, and the second drain electrode 230 may be disposed. Here, the second oxide transistor 250 may serve as a driving transistor of the sub-pixel circuit SPC including the second oxide semiconductor pattern 130 not including Sn. The transistor may have a relatively large driving range. In addition, the second oxide transistor 250 may serve as a transistor having a top gate structure.

In example embodiments, the second oxide transistor 250 has a top gate structure, but not being limited thereto. For example, the second oxide transistor 250 may have a bottom gate structure or a double gate structure.

In addition, a configuration of the second oxide transistor 250 includes the second oxide semiconductor pattern 130, the second gate electrode 170, the second source electrode 210, and the second drain electrode 230, but is not limited thereto. For example, the second oxide transistor 250 may have a configuration including the second oxide semiconductor pattern 130, the gate insulation layer 150, the second gate electrode 170, the insulating interlayer 190, the second source electrode 210, and the second drain electrode 230.

The third source electrode 215 and the third drain electrode 235 may be disposed in the display region 10 on the insulating interlayer 190. The third source electrode 215 may be in contact with a source region of the third oxide semiconductor pattern 135 via a fifth contact hole formed by removing a fifth portion of the gate insulation layer 150 and the insulating interlayer 190, and the third drain electrode 235 may be in contact with a drain region of the third oxide semiconductor pattern 135 via a sixth contact hole formed by removing a sixth portion of the gate insulation layer 150 and the insulating interlayer 190. Each of the third source electrode 215 and the third drain electrode 235 may include a metal, an alloy, metal nitride, conductive metal oxide, transparent conductive materials, and so forth. These may be used alone or in a suitable combination thereof. Alternatively, each of the third source and third drain electrodes 215 and 235 may have a multi-layered structure including a plurality of layers. Accordingly, the third oxide transistor 255 including the third oxide semiconductor pattern 135, the third gate electrode 175, the third source electrode 215, and the third drain electrode 235 may be disposed. Here, the third oxide transistor 255 may serve as a switching transistor of the sub-pixel circuit SPC including the third oxide semiconductor pattern 135 that includes Sn. The transistor may have a relatively high electron mobility. In addition, the third oxide transistor 255 may serve as a transistor having a top gate structure.

In example embodiments, the OLED display device 100 has a configuration including two transistors (e.g., the second oxide transistor 250 and the third oxide transistor 255), but not being limited thereto. For example, the OLED display device 100 may have a configuration including at least three transistors and at least one capacitor.

In addition, the third oxide transistor 255 has a top gate structure, but is not limited thereto. For example, the third oxide transistor 255 may have a bottom gate structure or a double gate structure.

Further, a configuration of the third oxide transistor 255 includes the third oxide semiconductor pattern 135, the third gate electrode 175, the third source electrode 215, and the third drain electrode 235, but is not limited thereto. For example, the third oxide transistor 255 may have a configuration including the third oxide semiconductor pattern 135, the gate insulation layer 150, the third gate electrode 175, the insulating interlayer 190, the third source electrode 215, and the third drain electrode 235.

The planarization layer 270 may be disposed on the insulating interlayer 190, the first source and first drain electrodes 610 and 630, the second source and second drain electrodes 210 and 230, and the third source and third drain electrodes 215 and 235. For example, the planarization layer 270 may be disposed with a high thickness to sufficiently cover the first source and first drain electrodes 610 and 630, the second source and second drain electrodes 210 and 230, and the third source and third drain electrodes 215 and 235 on the insulating interlayer 190. In this case, the planarization layer 270 may have a substantially flat upper surface, and a planarization process may be further performed on the planarization layer 270 to implement the flat upper surface of the planarization layer 270. A portion of an upper surface of the third drain electrode 235 may be exposed via a contact hole formed by removing a portion of the planarization layer 270. The planarization layer 270 may include organic materials or inorganic materials. In example embodiments, the planarization layer 270 may include organic materials such as polyimide, epoxy-based resin, acryl-based resin, polyester, photoresist, polyacryl-based resin, polyimide-based resin, a polyamide-based resin, a siloxane-based resin, and so forth.

The lower electrode 290 may be disposed in the display region 10 on the planarization layer 270. The lower electrode 290 may be in direct contact with the third drain electrode 235 via the contact hole of the planarization layer 270, and may be electrically connected to the third oxide transistor 255. The lower electrode 290 may include a metal, a metal alloy, metal nitride, conductive metal oxide, transparent conductive materials, and so forth. These may be used alone or in a suitable combination thereof. Alternatively, the lower electrode 290 may have a multi-layered structure including a plurality of layers.

The pixel defining layer 310 may be disposed on a portion of the lower electrode 290 and the planarization layer 270. The pixel defining layer 310 may cover both lateral portions of the lower electrode 290, and may expose a portion of an upper surface of the lower electrode 290. The pixel defining layer 310 may include organic materials or inorganic materials. In example embodiments, the pixel defining layer 310 may include organic materials.

The light emitting layer 330 may be disposed on the lower electrode 290 exposed by the pixel defining layer 310. The light emitting layer 330 may be formed using at least one of light emitting materials capable of generating different colors of light (e.g., a red color of light, a blue color of light, and a green color of light, among other colors) according to first, second, and third OLEDs. Alternatively, the light emitting layer 330 may generate a white color of light by stacking a plurality of light emitting materials capable of generating different colors of light such as a red color of light, a green color of light, a blue color of light, etc. In this case, a color filter may be disposed on the light emitting layer 330 (e.g., to overlap the light emitting layer 330 in lower or upper surfaces of the encapsulation substrate 450). The color filter may include at least one selected from a red color filter, a green color filter, and a blue color filter. Alternatively, the color filter may include a yellow color filter, a cyan color filter, and a magenta color filter. The color filter may include a photosensitive resin, color photoresist, etc.

The upper electrode 340 may be disposed on the pixel defining layer 310 and the light emitting layer 330. The upper electrode 340 may cover the light emitting layer 330 and the pixel defining layer 310, and may be entirely disposed on the light emitting layer 330 and the pixel defining layer 310. In some example embodiments, the upper electrode 340 may be disposed in the peripheral region 20. The upper electrode 340 may include a metal, a metal alloy, metal nitride, conductive metal oxide, transparent conductive materials, and so forth. These may be used alone or in a suitable combination thereof. Alternatively, the upper electrode 340 may have a multi-layered structure including a plurality of layers. Accordingly, the sub-pixel structure 200 including the lower electrode 290, the light emitting layer 330, and the upper electrode 340 may be disposed.

The seal member 390 may be disposed in an outmost portion of the peripheral region 20 on the substrate 110. In other words, the seal member 390 may be disposed in the outmost portion of the peripheral region 20 between the substrate 110 and the encapsulation substrate 450. An upper surface of the seal member 390 may be in direct contact with a lower surface of the encapsulation substrate 450, and a lower surface of the seal member 390 may be in direct contact with an upper surface of the insulating interlayer 190. Alternatively, the buffer layer 115, the gate insulation layer 150, and the insulating interlayer 190 on which the seal member 390 is located might not be disposed, and the lower surface of the seal member 390 may be in direct contact with an upper surface of the substrate 110. The seal member 390 may include frit, etc. In addition, the seal member 390 may additionally include a photo curable material. For example, the seal member 390 may include a compound such as the organic material and the photo curable material. In addition, after at least one of ultraviolet ray, laser beam, visible ray, etc. are irradiated in the compound, the compound may be cured, and thus the seal member 390 may be obtained. The photo curable material included in the seal member 390 may include epoxy acrylate-based resin, polyester acrylate-based resin, urethane acrylate based-resin, polybutadiene acrylate-based resin, silicon acrylate-based resin, alkyl acrylate-based resin, and so forth.

For example, a laser may be irradiated in the compound such as the organic material and the photo curable material. According to an irradiation of the light of the laser, a state of the compound (e.g., the seal member 390) may be changed from a solid state to a liquid state. In addition, the compound of the liquid state may be cured to the solid state after a predetermined time. In accordance with the state change of the compound, the compound may seal the substrate 110 and the encapsulation substrate 450.

In example embodiments, the seal member 390 has a trapezoidal shape where a width of an upper surface is less than a width of a lower surface, but is not limited thereto. For example, the seal member 390 may have a trapezoidal shape where a width of an upper surface is greater than a width of a lower surface, a tetragonal shape, a quadrate shape, etc.

The encapsulation substrate 450 may be disposed on the seal member 390 and the upper electrode 340. The encapsulation substrate 450 and the substrate 110 may include substantially same materials. For example, the encapsulation substrate 450 may include a quartz substrate, a synthetic quartz substrate, a calcium fluoride substrate, a fluoride-doped quartz substrate, a soda-lime glass substrate, a non-alkali glass substrate etc. In some example embodiments, the encapsulation substrate 450 may include a transparent inorganic material or flexible plastic. For example, the encapsulation substrate 450 may include a flexible transparent resin substrate. In this case, to increase flexibility of the OLED display device 100, the encapsulation substrate 450 may have a stacked structure where at least one inorganic layer and at least one organic layer are alternately stacked. The stack structure may include a first inorganic layer, an organic layer, and a second inorganic layer. For example, the first inorganic layer having flexibility may be disposed along a profile of the upper electrode 340, and the organic layer having flexibility may be disposed on the first inorganic layer. The second inorganic layer having flexibility may be disposed on the organic layer. That is, the stack structure may correspond to a thin film encapsulation structure that is in direct contact with the upper electrode 340.

As the OLED display device 100 in accordance with example embodiments includes the first oxide transistor 650 having a relatively high electron mobility, the gate driver 300 may include a relatively small number of transistors. Accordingly, a dead space of the OLED display device 100 may be reduced. In addition, as the gate driver 300 includes a relatively small number of transistors, a manufacturing cost of the OLED display device 100 may be decreased. Further, as the second oxide transistor 250 includes the second oxide semiconductor pattern 130 not including Sn, the second oxide transistor 250 may have a relatively large driving range.

FIGS. 5 through 11 are cross-sectional views illustrating a method of manufacturing an OLED display device in accordance with example embodiments.

Figure 5:
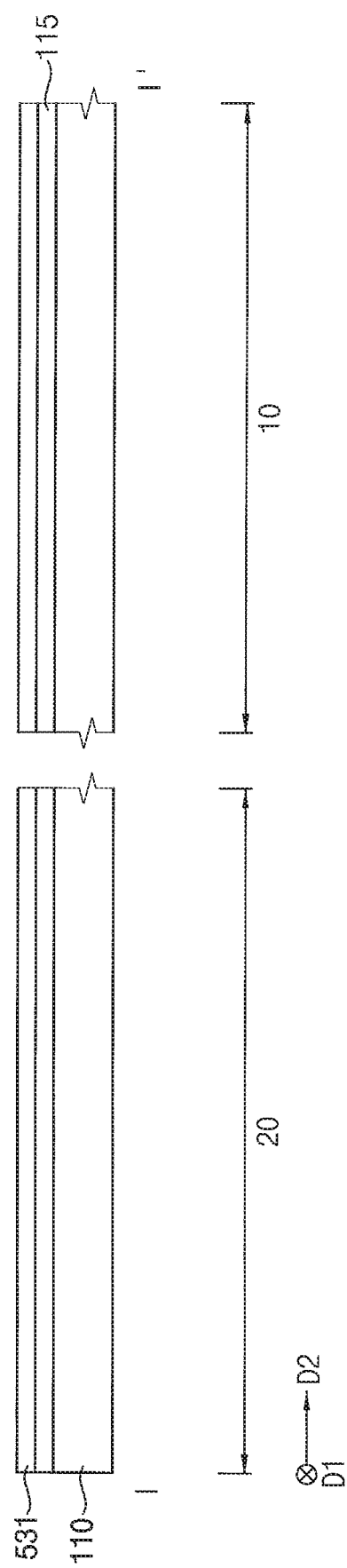
FIGS. 5, 6, 7, 8, 9, 10, and 11 are cross-sectional views illustrating a method of manufacturing an OLED display device in accordance with example embodiments.

Referring to FIG. 5, a substrate 110 including transparent or opaque insulation materials may be provided. The substrate 110 may be formed using at least one of quartz substrate, a synthetic quartz substrate, a calcium fluoride substrate, a fluoride-doped quartz substrate, a soda-lime glass substrate, a non-alkali glass substrate, a combination thereof, and so forth.

A buffer layer 115 may be formed on the entire substrate 110. The buffer layer 115 may prevent the diffusion of metal atoms and/or impurities from the substrate 110. In addition, the buffer layer 115 may improve a surface flatness of the substrate 110 when a surface of the substrate 110 is relatively irregular. According to a type of the substrate 110, at least two buffer layers 115 may be provided on the substrate 110, or the buffer layer 115 may not be formed. For example, the buffer layer 115 may include organic materials or inorganic materials. Alternatively, the substrate 110 may be formed using a flexible transparent resin substrate (e.g., a polyimide substrate). In this case, the polyimide substrate may include a first polyimide layer, a barrier film layer, a second polyimide layer, and so forth. For example, the substrate 110 may have a structure in which the first polyimide layer, the barrier film layer, and the second polyimide layer are sequentially stacked on a rigid glass substrate.

A first preliminary oxide semiconductor layer 531 may be formed on the buffer layer 115. The first preliminary oxide semiconductor layer 531 may be formed in the display region 10 and the peripheral region 20 on the entire buffer layer 115. After the first preliminary oxide semiconductor layer 531 is formed on the entire buffer layer 115, the first preliminary oxide semiconductor layer 531 may be selectively etched. For example, the first preliminary oxide semiconductor layer 531 may be etched through a first wet etch process. A first etchant used in the first wet etch process may be a compound that includes fluorine (F). For example, the first etchant may include sodium fluoride (NaF), sodium hydrogen fluoride ($NaHF_2$), ammonium fluoride ($NH_4F$), ammonium hydrogen fluoride ($NH_4HF_2$), ammonium borofluoride ($NH_4BF_4$), potassium fluoride (KF), potassium hydrogen fluoride ($KHF_2$), aluminum fluoride ($AlF_3$), borofluoric acid ($HBF_4$), lithium fluoride (LiF), potassium borofluoride ($KBF_4$), calcium fluoride ($CaF_2$), and so forth.

Figure 6:
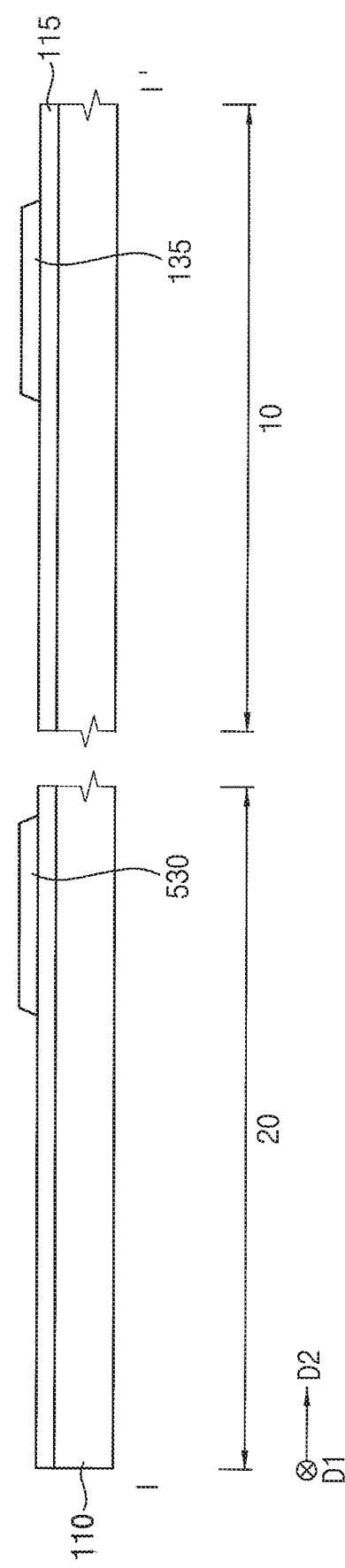

Referring to FIG. 6, after the first preliminary oxide semiconductor layer 531 is patterned through the first wet etch process, a first oxide semiconductor pattern 530 in the peripheral region 20 on the buffer layer 115 and a third oxide semiconductor pattern 135 in the display region 10 may be formed. Each of the first and third oxide semiconductor patterns 530 and 135 may be formed using an oxide semiconductor that includes Sn. In other words, each of the first and third oxide semiconductor patterns 530 and 135 may include an oxide semiconductor layer including at least one of $AB_x$, $AB_xC_y$, $AB_xC_yD_z$, and so forth. These compounds contain Sn together with In, Zn, Ga, Ti, Al, Hf, Zr, Mg, and so forth. For example, each of the first and third oxide semiconductor patterns 530 and 135 may include SnO, ITO, ZTO, IZTO, TAZO, IGTO, ITGZO, and so forth. In example embodiments, each of the first and third oxide semiconductor patterns 530 and 135 may consist essentially of ITGZO.

Figure 7:
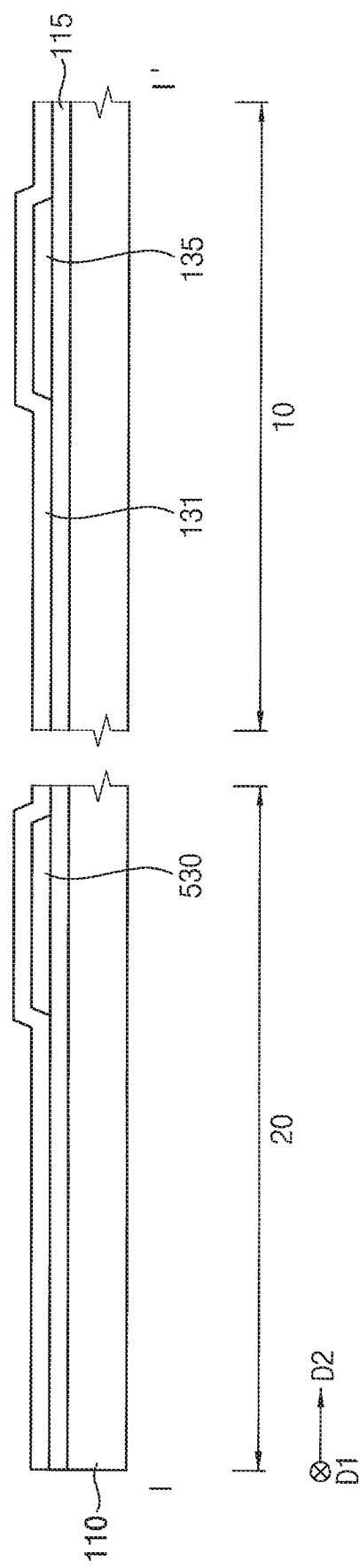

Referring to FIG. 7, a second preliminary oxide semiconductor layer 131 may be formed on the buffer layer 115, the first oxide semiconductor pattern 530, and the third oxide semiconductor pattern 135. The second preliminary oxide semiconductor layer 131 may be entirely formed in the display region 10 and the peripheral region 20 on the buffer layer 115 and the first and third oxide semiconductor patterns 530 and 135. Here, when the second preliminary oxide semiconductor layer 131 is formed on the buffer layer 115 and the first and third oxide semiconductor patterns 530 and 135, a lower surface of the second preliminary oxide semiconductor layer 131 may be in direct contact with an upper surface of the first oxide semiconductor pattern 530 and an upper surface of the third oxide semiconductor pattern 135. After the second preliminary oxide semiconductor layer 131 is entirely formed on the buffer layer 115 and the first and third oxide semiconductor patterns 530 and 135, the second preliminary oxide semiconductor layer 131 may be partially etched. For example, the second preliminary oxide semiconductor layer 131 may be etched through a second wet etch process. In example embodiments, a second etchant may be used in the second wet etch process, and the second etchant may be different from the first etchant. For example, the second etchant used in the second wet etch process may include an etchant where the first and third oxide semiconductor patterns 530 and 135 are not etched while the second preliminary oxide semiconductor layer 131 is etched. The second etchant may be a mixed solution containing phosphoric acid, acetic acid, nitric acid, and so forth. In example embodiments, the second etchant may consist essentially of phosphoric acetic nitric acid. In addition, the second etchant may be in direct contact with the first and third oxide semiconductor patterns 530 and 135. As each of the first and third oxide semiconductor patterns 530 and 135 includes Sn, each of the first and third oxide semiconductor patterns 530 and 135 might not react with the second etchant. In other words, each of the first and third oxide semiconductor patterns 530 and 135 might not be etched by the second etchant.

Figure 8:
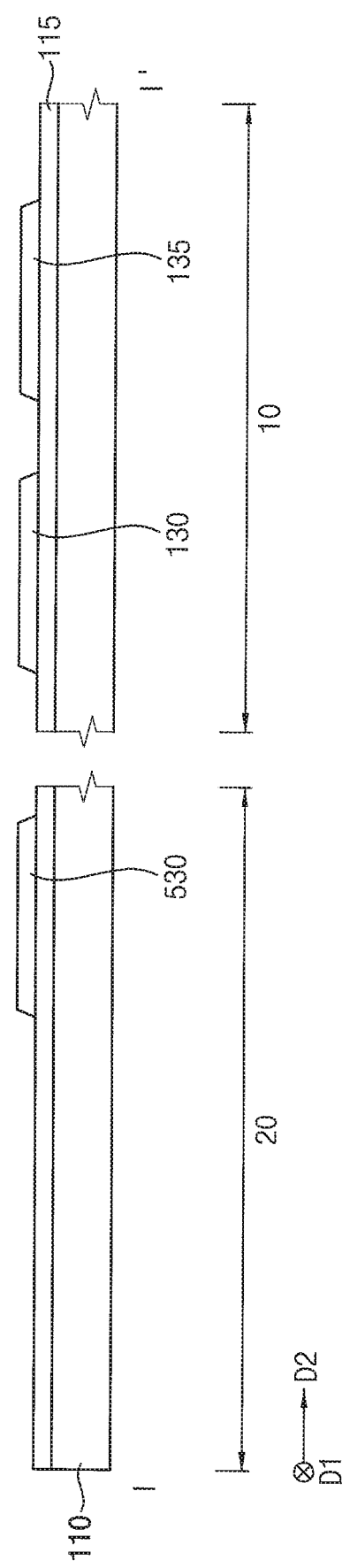

Referring to FIG. 8, after the second preliminary oxide semiconductor layer 131 is patterned through the second wet etch process, a second oxide semiconductor pattern 130 may be formed in the display region 10 on the buffer layer 115. The second oxide semiconductor pattern 130 may be spaced apart from the third oxide semiconductor pattern 135. The second oxide semiconductor pattern 130 may be formed using an oxide semiconductor not including Sn. In other words, the second oxide semiconductor pattern 130 may include an oxide semiconductor layer including at least one of $AB_x$, $AB_xC_y$, $AB_xC_yD_z$, and so forth. These compounds contain In, Zn, Ga, Ti, Al, Hf, Zr, Mg, and so forth. For example, the second oxide semiconductor pattern 130 may include ZnO, GaO, TiO, InO, IGO, IZO, GZO, ZMO, ZnZrO, IGZO, IGHO, and so forth. In example embodiments, the second oxide semiconductor pattern 130 may consist essentially of IGZO.

In example embodiments, although the first and third oxide semiconductor patterns 530 and 135 and the second oxide semiconductor pattern 130 are formed in different process steps, the first oxide semiconductor pattern 530, the second oxide semiconductor pattern 130, and the third oxide semiconductor pattern 135 may be located at a same layer (e.g., the buffer layer 115).

Figure 9:
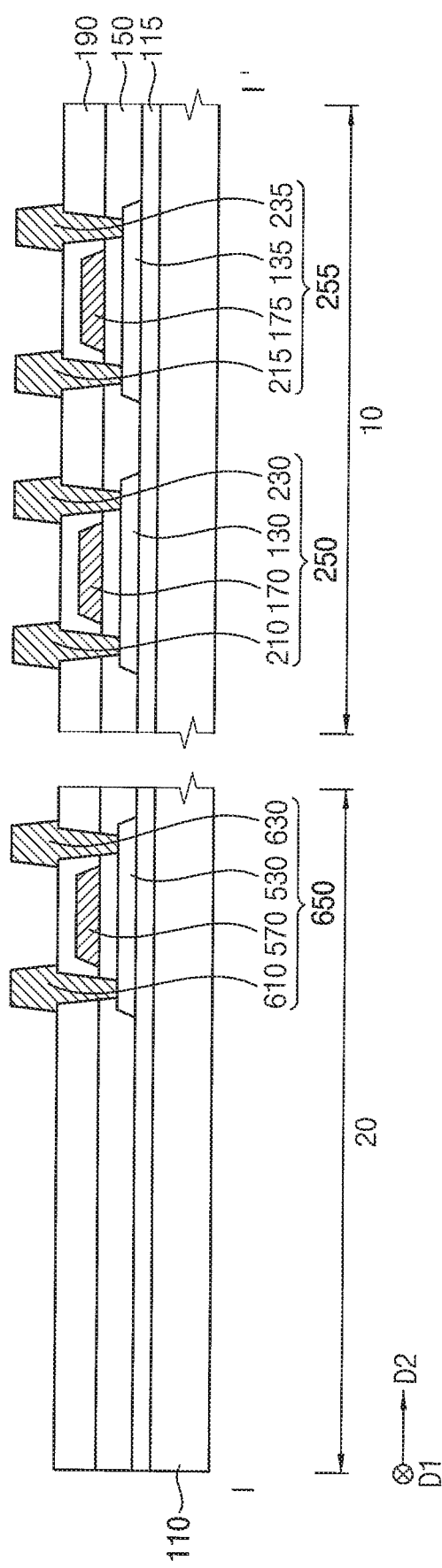

Referring to FIG. 9, a gate insulation layer 150 may be formed on the buffer layer 115 and the first, second, and third oxide semiconductor patterns 530, 130, and 135. The gate insulation layer 150 may cover the first oxide semiconductor pattern 530 in the peripheral region 20 on the buffer layer 115, and may extend in the second direction D2 on the buffer layer 115. In addition, the gate insulation layer 150 may cover the second and third oxide semiconductor patterns 130 and 135 in the display region 10 on the buffer layer 115, and may extend in the second direction D2 on the buffer layer 115. That is, the gate insulation layer 150 may be formed on the entire buffer layer 115. For example, the gate insulation layer 150 may sufficiently cover the first, second and third oxide semiconductor patterns 530, 130 and 135 on the buffer layer 115, and may have a substantially flat upper surface without a step around the first, second and third oxide semiconductor patterns 530, 130 and 135. Alternatively, the gate insulation layer 150 may cover the first, second and third oxide semiconductor patterns 530, 130 and 135 on the buffer layer 115, and may be formed as a substantially uniform thickness along a profile of the first, second and third oxide semiconductor patterns 530, 130 and 135. The gate insulation layer 150 may be formed using silicon compound, metal oxide, and so forth. For example, the gate insulation layer 150 may include $SiO_x$, $SiN_x$, $SiO_xN_y$, $SiO_xC_y$, $SiC_xN_y$, $AlO_x$, $AlN_x$, $TaO_x$, $HfO_x$, $ZrO_x$, $TiO_x$, and so forth.

A first gate electrode 570 may be formed in the peripheral region 20 on the gate insulation layer 150. The first gate electrode 570 may be formed on a portion of the gate insulation layer 150 under which the first oxide semiconductor pattern 530 is located. The first gate electrode 570 may be formed using a metal, a metal alloy, metal nitride, conductive metal oxide, transparent conductive materials, and so forth. For example, the first gate electrode 570 may include Au, Ag, Al, W, Cu, Pt, Ni, Ti, Pd, Mg, Ca, Li, Cr, Ta, Mo, Sc, Nd, Ir, an alloy of aluminum, $AlN_x$, an alloy of silver, $WN_x$, an alloy of copper, an alloy of molybdenum, $TiN_x$, $CrN_x$, $TaN_x$, SRO, $ZnO_x$, ITO, $SnO_x$, $InO_x$, $GaO_x$, IZO, and so forth. These may be used alone or in a suitable combination thereof. Alternatively, the first gate electrode 570 may have a multi-layered structure including a plurality of layers.

A second gate electrode 170 may be formed in the display region 10 on the gate insulation layer 150. The second gate electrode 170 may be formed on a portion of the gate insulation layer 150 under which the second oxide semiconductor pattern 130 is located. The second gate electrode 170 may be formed using a metal, a metal alloy, metal nitride, conductive metal oxide, transparent conductive materials, and so forth. These may be used alone or in a suitable combination thereof. Alternatively, the second gate electrode 170 may have a multi-layered structure including a plurality of layers.

A third gate electrode 175 may be formed in the display region 10 on the gate insulation layer 150, and may be spaced apart from the second gate electrode 170 in the second direction D2. The third gate electrode 175 may be formed on a portion of the gate insulation layer 150 under which the third oxide semiconductor pattern 135 is located. The third gate electrode 175 may be formed using a metal, a metal alloy, metal nitride, conductive metal oxide, transparent conductive materials, and so forth. These may be used alone or in a suitable combination thereof. Alternatively, the third gate electrode 175 may have a multi-layered structure including a plurality of layers.

For example, after a first preliminary electrode layer is formed on the entire gate insulation layer 150, the first gate electrode 570, the second gate electrode 170, and the third gate electrode 175 may be simultaneously formed by partially etching the first preliminary electrode layer. In other words, the first gate electrode 570, the second gate electrode 170, and the third gate electrode 175 may be formed using same materials, and may be located at a same layer (e.g., the gate insulation layer 150).

An insulating interlayer 190 may be formed on the gate insulation layer 150, the first gate electrode 570, the second gate electrode 170, and the third gate electrode 175. The insulating interlayer 190 may cover the first gate electrode 570 in the peripheral region 20 on the gate insulation layer 150, and may extend in the second direction D2 on the gate insulation layer 150. In addition, the insulating interlayer 190 may cover the second and third gate electrodes 170 and 175 in the display region 10 on the gate insulation layer 150, and may extend in the second direction D2 on the gate insulation layer 150. That is, the insulating interlayer 190 may be formed on the entire gate insulation layer 150. For example, the insulating interlayer 190 may sufficiently cover the first, second, and third gate electrodes 570, 170, and 175 on the gate insulation layer 150, and may have a substantially flat upper surface without a step around the first, second, and third gate electrodes 570, 170, and 175. Alternatively, the insulating interlayer 190 may cover the first, second, and third gate electrodes 570, 170, and 175 on the gate insulation layer 150, and may be formed as a substantially uniform thickness along a profile of the first, second, and third gate electrodes 570, 170, and 175. The insulating interlayer 190 may be formed using silicon compound, metal oxide, etc.

A first source electrode 610 and a first drain electrode 630 may be formed in the peripheral region 20 on the insulating interlayer 190. The first source electrode 610 may be in contact with a source region of the first oxide semiconductor pattern 530 via a first contact hole formed by removing a first portion of the gate insulation layer 150 and the insulating interlayer 190, and the first drain electrode 630 may be in contact with a drain region of the first oxide semiconductor pattern 530 via a second contact hole formed by removing a second portion of the gate insulation layer 150 and the insulating interlayer 190. Each of the first source electrode 610 and the first drain electrode 630 may be formed using a metal, an alloy, metal nitride, conductive metal oxide, transparent conductive materials, and so forth. These may be used alone or in a suitable combination thereof. Alternatively, each of the first source and first drain electrodes 610 and 630 may have a multi-layered structure including a plurality of layers. Accordingly, a first oxide transistor 650 including the first oxide semiconductor pattern 530, the first gate electrode 570, the first source electrode 610, and the first drain electrode 630 may be formed.

A second source electrode 210 and a second drain electrode 230 may be formed in the display region 10 on the insulating interlayer 190. The second source electrode 210 may be in contact with a source region of the second oxide semiconductor pattern 130 via a third contact hole formed by removing a third portion of the gate insulation layer 150 and the insulating interlayer 190, and the second drain electrode 230 may be in contact with a drain region of the second oxide semiconductor pattern 130 via a fourth contact hole formed by removing a fourth portion of the gate insulation layer 150 and the insulating interlayer 190. Each of the second source electrode 210 and the second drain electrode 230 may be formed using a metal, an alloy, metal nitride, conductive metal oxide, transparent conductive materials, and so forth. These may be used alone or in a suitable combination thereof. Alternatively, each of the second source and second drain electrodes 210 and 230 may have a multi-layered structure including a plurality of layers. Accordingly, a second oxide transistor 250 including the second oxide semiconductor pattern 130, the second gate electrode 170, the second source electrode 210, and the second drain electrode 230 may be formed.

A third source electrode 215 and a third drain electrode 235 may be formed in the display region 10 on the insulating interlayer 190. The third source electrode 215 may be in contact with a source region of the third oxide semiconductor pattern 135 via a fifth contact hole formed by removing a fifth portion of the gate insulation layer 150 and the insulating interlayer 190, and the third drain electrode 235 may be in contact with a drain region of the third oxide semiconductor pattern 135 via a sixth contact hole formed by removing a sixth portion of the gate insulation layer 150 and the insulating interlayer 190. Each of the third source electrode 215 and the third drain electrode 235 may be formed using a metal, an alloy, metal nitride, conductive metal oxide, transparent conductive materials, and so forth. These may be used alone or in a suitable combination thereof. Alternatively, each of the third source and third drain electrodes 215 and 235 may have a multi-layered structure including a plurality of layers. Accordingly, a third oxide transistor 255 including the third oxide semiconductor pattern 135, the third gate electrode 175, the third source electrode 215, and the third drain electrode 235 may be formed.

For example, after a second preliminary electrode layer is formed on the entire insulating interlayer 190, the first source and first drain electrodes 610 and 630, the second source and second drain electrodes 210 and 230, and the third source and third drain electrodes 215 and 235 may be simultaneously formed by partially etching the second preliminary electrode layer. In other words, the first source and first drain electrodes 610 and 630, the second source and second drain electrodes 210 and 230, and the third source and third drain electrodes 215 and 235 may be formed using same materials, and may be located at a same layer (e.g., the insulating interlayer 190).

Figure 10:
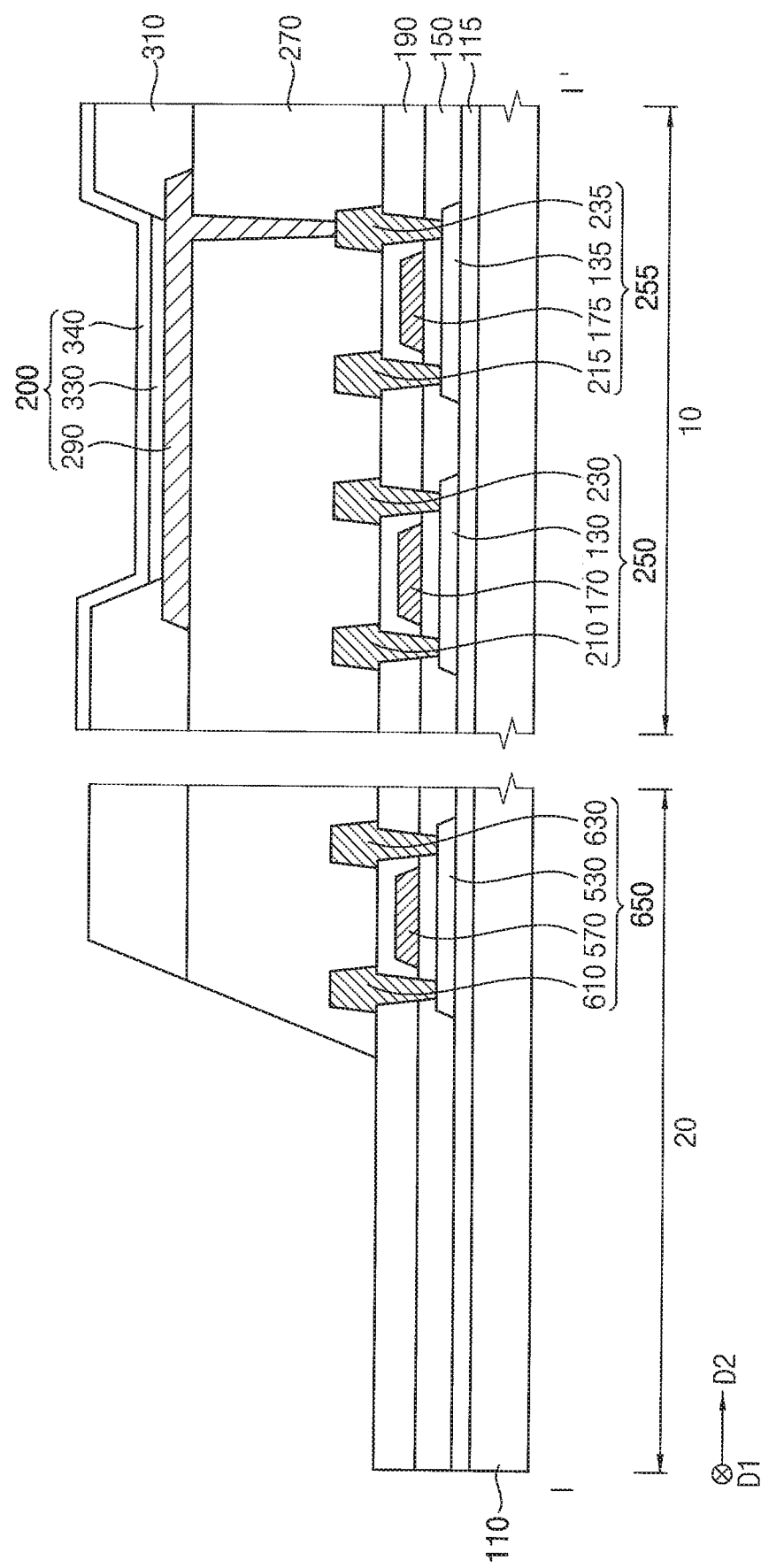

Referring to FIG. 10, a planarization layer 270 may be formed on the insulating interlayer 190, the first source and first drain electrodes 610 and 630, the second source and second drain electrodes 210 and 230, and the third source and third drain electrodes 215 and 235. For example, the planarization layer 270 may be formed with a high thickness to sufficiently cover the first source and first drain electrodes 610 and 630, the second source and second drain electrodes 210 and 230, and the third source and third drain electrodes 215 and 235 on the insulating interlayer 190. In this case, the planarization layer 270 may have a substantially flat upper surface, and a planarization process may be further performed on the planarization layer 270 to implement the flat upper surface of the planarization layer 270. A portion of an upper surface of the third drain electrode 235 may be exposed via a contact hole formed by removing a portion of the planarization layer 270. The planarization layer 270 may include organic materials or inorganic materials. In example embodiments, the planarization layer 270 may be formed using organic materials such as polyimide, epoxy-based resin, acryl-based resin, polyester, photoresist, polyacryl-based resin, polyimide-based resin, a polyamide-based resin, a siloxane-based resin, and so forth.

A lower electrode 290 may be formed in the display region 10 on the planarization layer 270. The lower electrode 290 may be in direct contact with the third drain electrode 235 via the contact hole of the planarization layer 270. The lower electrode 290 may be formed using a metal, a metal alloy, metal nitride, conductive metal oxide, transparent conductive materials, and so forth. These may be used alone or in a suitable combination thereof. Alternatively, the lower electrode 290 may have a multi-layered structure including a plurality of layers.

A pixel defining layer 310 may be formed on a portion of the lower electrode 290 and the planarization layer 270. The pixel defining layer 310 may cover both lateral portions of the lower electrode 290, and may expose a portion of an upper surface of the lower electrode 290. The pixel defining layer 310 may include organic materials or inorganic materials. In example embodiments, the pixel defining layer 310 may be formed using organic materials.

A light emitting layer 330 may be formed on the lower electrode 290 exposed by the pixel defining layer 310. The light emitting layer 330 may be formed using at least one of light emitting materials capable of generating different colors of light (e.g., a red color of light, a blue color of light, and a green color of light, etc) according to first, second, and third OLEDs. Alternatively, the light emitting layer 330 may generate a white color of light by stacking a plurality of light emitting materials capable of generating different colors of light such as a red color of light, a green color of light, a blue color of light, etc. In this case, a color filter may be formed on the light emitting layer 330. The color filter may include at least one selected from a red color filter, a green color filter, and a blue color filter. Alternatively, the color filter may include a yellow color filter, a cyan color filter, and a magenta color filter. The color filter may be formed using a photosensitive resin, color photoresist, etc.

An upper electrode 340 may be formed on the pixel defining layer 310 and the light emitting layer 330. The upper electrode 340 may cover the light emitting layer 330 and the pixel defining layer 310, and may be entirely formed on the light emitting layer 330 and the pixel defining layer 310. In some example embodiments, the upper electrode 340 may be formed in the peripheral region 20. The upper electrode 340 may be formed using a metal, a metal alloy, metal nitride, conductive metal oxide, transparent conductive materials, and so forth. These may be used alone or in a suitable combination thereof. Alternatively, the upper electrode 340 may have a multi-layered structure including a plurality of layers. Accordingly, a sub-pixel structure 200 including the lower electrode 290, the light emitting layer 330, and the upper electrode 340 may be formed.

Figure 11:
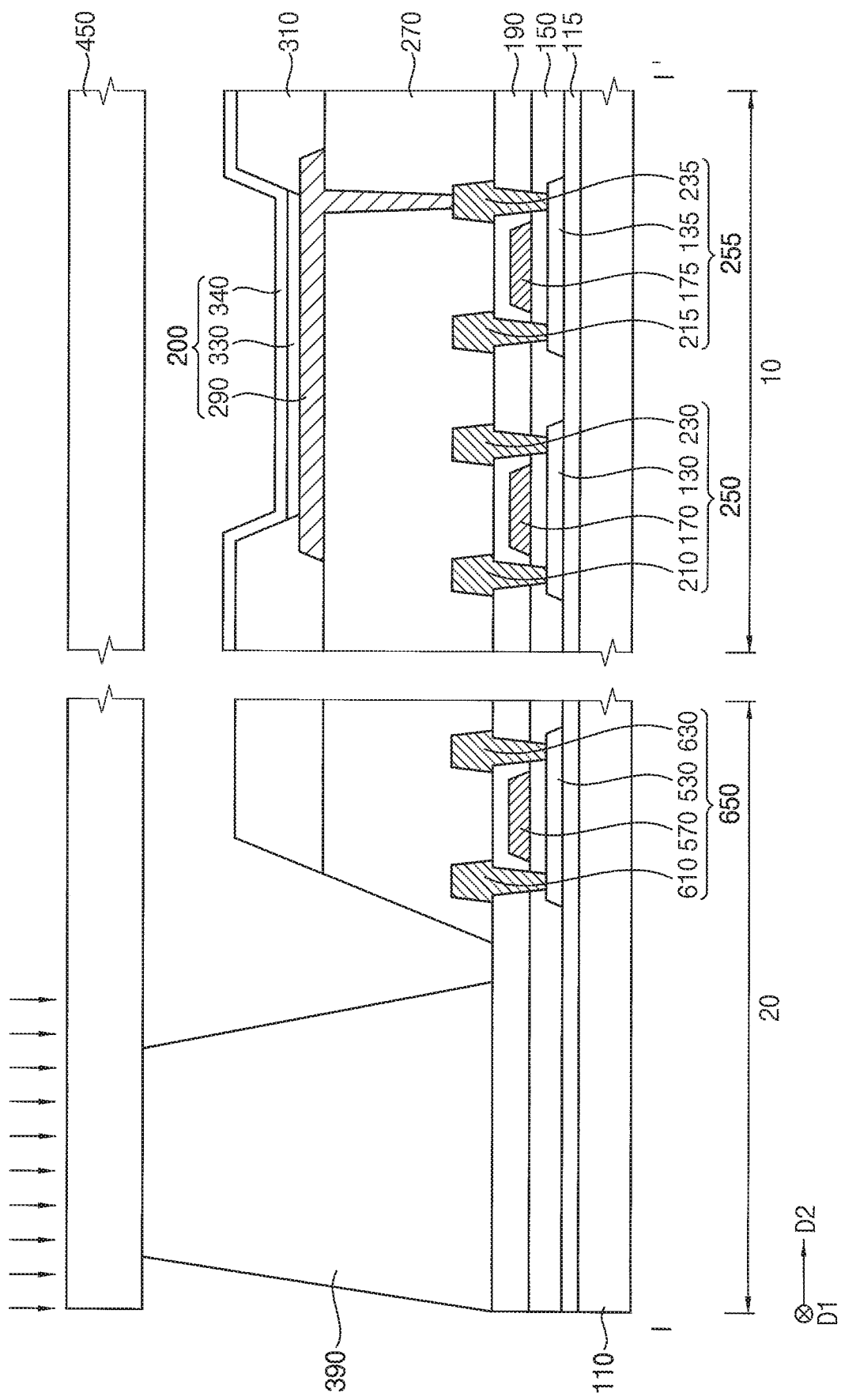

Referring to FIG. 11, a seal member 390 may be formed in an outmost portion of the peripheral region 20 on the substrate 110. A lower surface of the seal member 390 may be in direct contact with the insulating interlayer 190. Alternatively, the buffer layer 115, the gate insulation layer 150, and the insulating interlayer 190 on which the seal member 390 is located might not be formed, and the lower surface of the seal member 390 may be in direct contact with an upper surface of the substrate 110. The seal member 390 may be formed using frit, etc. In addition, the seal member 390 may additionally include a photo curable material. For example, the seal member 390 may include a compound such as the organic material and the photo curable material. In addition, after at least one of ultraviolet ray, laser beam, visible ray, and so forth. are irradiated in the compound, the compound may be cured, and thus the seal member 390 may be obtained. The photo curable material included in the seal member 390 may include epoxy acrylate-based resin, polyester acrylate-based resin, urethane acrylate based-resin, polybutadiene acrylate-based resin, silicon acrylate-based resin, alkyl acrylate-based resin, etc.

An encapsulation substrate 450 may be formed on the seal member 390 and the upper electrode 340. The encapsulation substrate 450 and the substrate 110 may include substantially same materials. For example, the encapsulation substrate 450 may be formed using at least one of quartz substrate, a synthetic quartz substrate, a calcium fluoride substrate, a fluoride-doped quartz substrate, a soda-lime glass substrate, a non-alkali glass substrate and so forth. In some example embodiments, the encapsulation substrate 450 may include a transparent inorganic material or flexible plastic. For example, the encapsulation substrate 450 may include a flexible transparent resin substrate. In this case, to increase flexibility of the OLED display device, the encapsulation substrate 450 may have a stacked structure where at least one inorganic layer and at least one organic layer are alternately stacked. The stacked structure may include a first inorganic layer, an organic layer, and a second inorganic layer. For example, the first inorganic layer having flexibility may be formed along a profile of the upper electrode 340, and the organic layer having flexibility may be formed on the first inorganic layer. The second inorganic layer having flexibility may be formed on the organic layer. That is, the stacked structure may correspond to a thin film encapsulation structure that is in direct contact with the upper electrode 340.

After the encapsulation substrate 450 is formed, a laser may be irradiated in a portion where an upper surface of the encapsulation substrate 450 overlaps the seal member 390. According to an irradiation of the light of the laser, a state of the compound of the seal member 390 may be changed from a solid state to a liquid state. In addition, the compound of the liquid state may be cured to the solid state after a predetermined time. In accordance with the state change of the compound, the compound may seal the substrate 110 and the encapsulation substrate 450. Accordingly, an OLED display device 100 illustrated in FIG. 4 may be manufactured.

In a method of manufacturing the OLED display device according to example embodiments, as oxide transistors having different characteristics to each other are manufactured in a same layer by using the first etchant and the second etchant without an add of a mask, a manufacturing cost of the OLED display device may be relatively reduced.

Figure 12:
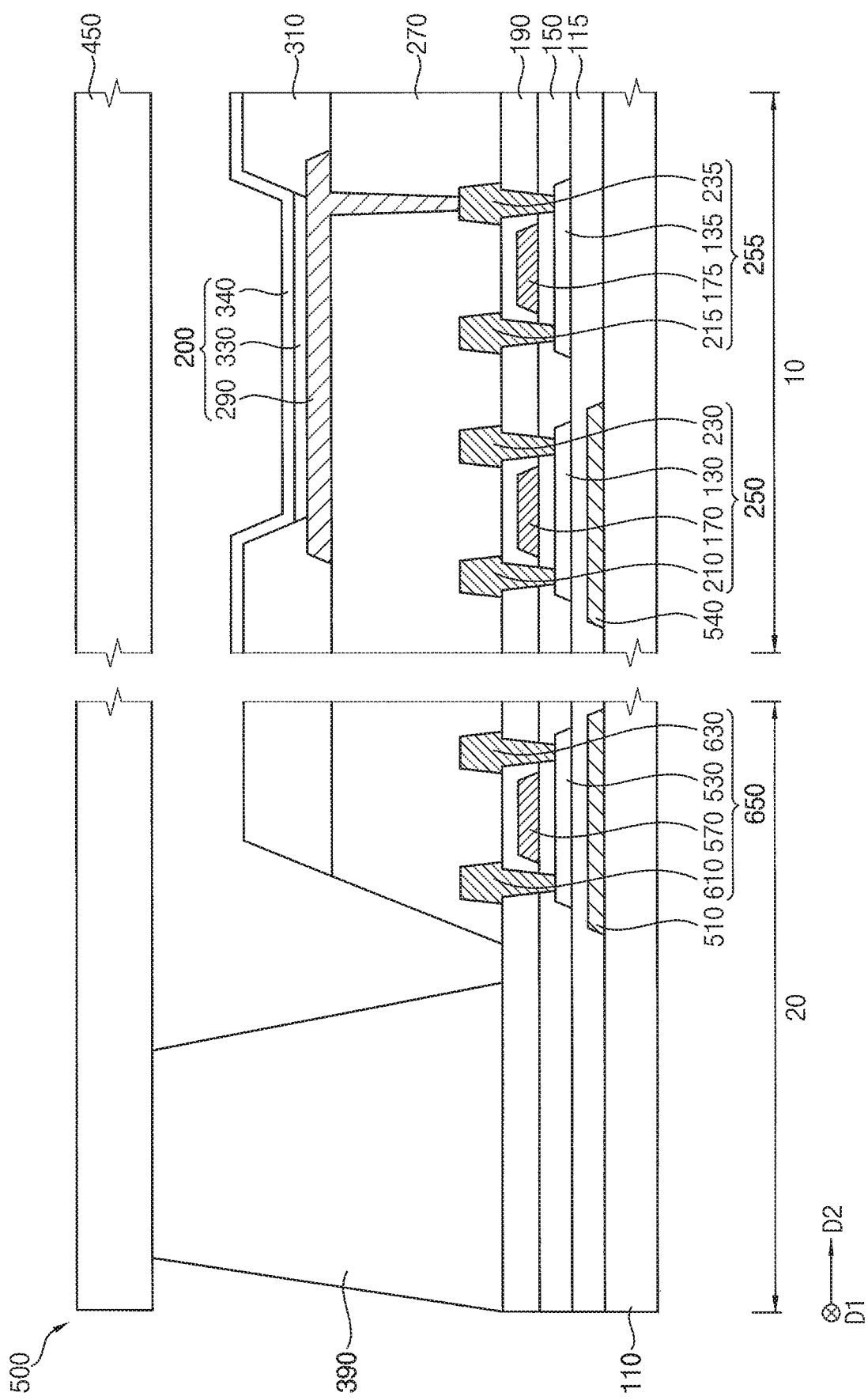
FIG. 12 is a plan view illustrating an OLED display device in accordance with example embodiments.

FIG. 12 is a plan view illustrating an OLED display device in accordance with example embodiments. An OLED display device 500 illustrated in FIG. 12 may have a configuration substantially the same as or similar to that of an OLED display device 100 described with reference to FIGS. 1 through 4 except for a first bottom metal pattern 510 and a second bottom metal pattern 540. In FIG. 12, detailed descriptions for elements that are substantially the same as or similar to elements described with reference to FIGS. 1 through 4 may not be repeated.

Referring to FIG. 12, an OLED display device 500 may include a substrate 110, a first bottom metal pattern 510, a second bottom metal pattern 540, a buffer layer 115, a first oxide transistor 650, a second oxide transistor 250, a third oxide transistor 255, a gate insulation layer 150, an insulating interlayer 190, a planarization layer 270, a sub-pixel structure 200, a pixel defining layer 310, a seal member 390, an encapsulation substrate 450, etc. The first oxide transistor 650 may include a first oxide semiconductor pattern 530, a first gate electrode 570, a first source electrode 610, and a first drain electrode 630, and the second oxide transistor 250 may include a second oxide semiconductor pattern 130, a second gate electrode 170, a second source electrode 210, and a second drain electrode 230. In addition, the third oxide transistor 255 may include a third oxide semiconductor pattern 135, a third gate electrode 175, a third source electrode 215, and a third drain electrode 235. Further, the sub-pixel structure 200 may include a lower electrode 290, a light emitting layer 330, and an upper electrode 340. As the OLED display device 500 has the display region 10 and the peripheral region 20, the substrate 110 may be divided as the display region 10 and the peripheral region 20.

The first bottom metal pattern 510 may be disposed in the peripheral region 20 between the substrate 110 and the buffer layer 115. The first bottom metal pattern 510 may be located under the first oxide transistor 650. In example embodiments, the first bottom metal pattern 510 may be electrically connected to the first gate electrode 570. In this case, the first oxide transistor 650 may serve as a transistor having a double gate structure. Accordingly, the first oxide transistor 650 may operate as a transistor of a gate driver 300 driven by using a high current.

The second bottom metal pattern 540 may be disposed in the display region 10 between the substrate 110 and the buffer layer 115. The second bottom metal pattern 540 may be located under the second oxide transistor 250. In example embodiments, the second bottom metal pattern 540 may be electrically connected to the second source electrode 210. In this case, an output saturation characteristic of the second oxide transistor 250 may be increased, and a driving range of the second oxide transistor 250 may be secured.

In some example embodiments, the OLED display device 500 may further include a third bottom metal pattern disposed under the third oxide transistor 255. In some example embodiments, the OLED display device 500 may further include an insulation layer disposed under the first bottom metal pattern 510 and the second bottom metal pattern 540.

The present inventive concept may be applied to various display devices including an organic light emitting diode display device. For example, the present inventive concept may be applied to vehicle-display device, a ship-display device, an aircraft-display device, portable communication devices, display devices for display or for information transfer, a medical-display device, etc.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. An organic light emitting diode ("OLED") display device comprising:
a substrate having a display region including a plurality of sub-pixel regions, the substrate having a peripheral region located at a side of the display region;
a first oxide transistor in the peripheral region on the substrate, the first oxide transistor including a first oxide semiconductor pattern that includes tin (Sn);
a second oxide transistor in the sub-pixel regions each on the substrate, the second oxide transistor including a second oxide semiconductor pattern;
a third oxide transistor in the sub-pixel regions each on the substrate, the third oxide transistor including a third oxide semiconductor pattern, the third oxide semiconductor pattern including Sn; and
a sub-pixel structure on the second oxide transistor, the sub-pixel structure including:
a lower electrode;
a light emitting layer disposed on the lower electrode; and
an upper electrode disposed on the light emitting layer,
wherein the second oxide transistor corresponds to a driving transistor, and the third oxide transistor corresponds to a switching transistor,
wherein the second oxide semiconductor pattern does not include Sn, and
wherein each of the second oxide transistor and the third oxide transistor overlaps the lower electrode of the sub-pixel structure.

2. The OLED display device of claim 1, wherein the first oxide transistor and the second oxide transistor are located at a same layer.

3. The OLED display device of claim 1, wherein the first oxide transistor further includes: a first gate electrode disposed on the first oxide semiconductor pattern; and first source and first drain electrodes disposed on the first gate electrode.

4. The OLED display device of claim 1, further comprising:
a gate driver generating a gate signal, the gate driver being disposed in the peripheral region on the substrate, the gate driver including a transistor,
wherein the transistor included in the gate driver corresponds to the first oxide transistor.

5. The OLED display device of claim 1, wherein the first oxide semiconductor pattern, the second oxide semiconductor pattern, and the third oxide semiconductor pattern are located at a same layer.

6. The OLED display device of claim 5, wherein the first oxide semiconductor pattern and the third oxide semiconductor pattern include same materials.

7. The OLED display device of claim 1, wherein the first oxide semiconductor pattern includes at least one of tin oxide (SnO), indium-tin oxide (ITO), zinc-tin oxide (ZTO), indium-zinc-tin oxide (IZTO), tin-aluminum-zinc oxide (TAZO), indium-gallium-tin oxide (IGTO), and indium-tin-gallium-zinc oxide (ITGZO).

8. The OLED display device of claim 1, wherein the second oxide semiconductor pattern includes at least one of zinc oxide (ZnO), gallium oxide (GaO), titanium oxide (TiO), indium oxide (InO), indium-gallium oxide (IGO), indium-zinc oxide (IZO), gallium-zinc oxide (GZO), zinc-magnesium oxide (ZMO), zinc-zirconium oxide (ZnZrO), indium-gallium-zinc oxide (IGZO), and indium-gallium-hafnium oxide (IGHO).

* * * * *